United States Patent
Cosemans et al.

(10) Patent No.: US 11,699,482 B2
(45) Date of Patent: Jul. 11, 2023

(54) ANALOG IN-MEMORY COMPUTING BASED INFERENCE ACCELERATOR

(71) Applicant: IMEC vzw, Leuven (BE)

(72) Inventors: Stefan Cosemans, Leuven (BE); Ioannis Papistas, Leuven (BE); Peter Debacker, Blanden (BE)

(73) Assignee: IMEC vzw, Leuven (BE)

( * ) Notice: Subject to any disclaimer, the term of this patent is extended or adjusted under 35 U.S.C. 154(b) by 97 days.

(21) Appl. No.: 17/447,131

(22) Filed: Sep. 8, 2021

(65) Prior Publication Data

US 2022/0076737 A1    Mar. 10, 2022

(30) Foreign Application Priority Data

Sep. 9, 2020 (EP) ..................................... 20195364

(51) Int. Cl.
*G11C 11/54* (2006.01)
*G11C 11/4096* (2006.01)
*G06N 20/00* (2019.01)
*G06F 17/16* (2006.01)
*G11C 11/4074* (2006.01)
(Continued)

(52) U.S. Cl.
CPC .......... *G11C 11/4096* (2013.01); *G06F 17/16* (2013.01); *G06J 1/00* (2013.01); *G06N 20/00* (2019.01); *G11C 11/4074* (2013.01); *G11C 11/4094* (2013.01); *G11C 11/413* (2013.01); *G11C 11/419* (2013.01); *G11C 11/54* (2013.01); *G11C 27/00* (2013.01); *H03K 7/08* (2013.01)

(58) Field of Classification Search
CPC . G11C 11/4096; G11C 11/4074; G06F 17/16; G06N 20/00; G06N 3/044; G06N 3/045; G06N 3/063; H03K 7/08
See application file for complete search history.

(56) References Cited

U.S. PATENT DOCUMENTS 10,642,922 B2 *   5/2020   Knag ..................... G11C 11/54
2019/0311243 A1   10/2019   Whatmough et al.
(Continued)

OTHER PUBLICATIONS

Extended European Search Report dated Apr. 12, 2021 in European Application No. 20195364.3, in 9 pages.
(Continued)

*Primary Examiner* — Mushfique Siddique
(74) *Attorney, Agent, or Firm* — Knobbe Martens Olson & Bear LLP

(57) ABSTRACT

A compute cell for in-memory multiplication of a digital data input and a balanced ternary weight, and an in-memory computing device including an array of the compute cells, are provided. In one aspect, the compute cell includes a set of input connectors for receiving modulated input signals representative of a sign and a magnitude of the data input, and a memory unit configured to store the ternary weight. A logic unit connected to the set of input connectors and the memory unit receives the data input and the ternary weight. The logic unit selectively enables one of a plurality of conductive paths for supplying a partial charge to a read bit line during a compound duty cycle of the set of input signals as a function of the respective signs of data input and ternary weight, and disables each of the plurality of conductive paths if at least one of the ternary weight and data input have zero magnitude.

20 Claims, 7 Drawing Sheets

(51) Int. Cl.
  *G11C 11/4094* (2006.01)
  *H03K 7/08* (2006.01)
  *G06J 1/00* (2006.01)
  *G11C 11/419* (2006.01)
  *G11C 11/413* (2006.01)
  *G11C 27/00* (2006.01)

(56) References Cited

U.S. PATENT DOCUMENTS

| | | | |
|---|---|---|---|
| 2020/0301668 A1* | 9/2020 | Li | G11C 11/54 |
| 2021/0005230 A1* | 1/2021 | Wang | G11C 7/106 |
| 2021/0089272 A1* | 3/2021 | Jain | G06N 3/063 |
| 2021/0241820 A1* | 8/2021 | Biswas | G11C 5/06 |
| 2022/0318610 A1* | 10/2022 | Seo | G06F 9/3877 |

OTHER PUBLICATIONS

Jain et al. "TiM-DNN: Ternary In-Memory Accelerator for Deep Neural Networks"; IEEE Transactions on Very Large Scale Integrations (VLSI) Systems; vol. 28, No. 7, Jul. 1, 2020; pp. 1567-1577.

Thirumala et al. "Ternary Compute-Enabled Memory using Ferroelectric Transistors for Accelerating Deep Neural Networks "; 2020 Design, Automation & Test in Europe Conference & Exhibition; Mar. 2020; pp. 31-36.

Cosemans et al. "Towards 10000TOPS/W DNN Inference with Analog in-Memory Computing—A Circuit Blueprint, Device Options and Requirements"; 2019 IEEE International Electron Devices Meeting (IEDM); Dec. 2019; p. 22.2.1-22.2.4.

Zhang et al. "In-Memory Computation of a Machine-Learning Classifier in a Standard 6T SRAM Array"; IEEE Journal of Solid-State Circuits; vol. 52; No. 4; Apr. 2017; pp. 915-924.

Moopenn et al. "Programmable Synaptic Chip for Electronic Neural Networks"; American Institute of Physics; 1988; pp. 564-572.

RRAM-Based In-Memory Computing for Embedded Deep Neural Networks by Bankman et al., 53rd Asilomar Conference on Signals, Systems, and Computers, Pacific Grove, CA, USA, 2019.

\* cited by examiner

ANALOG IN-MEMORY COMPUTING BASED INFERENCE ACCELERATOR

CROSS-REFERENCE TO RELATED APPLICATIONS

This application claims foreign priority to European Application No. 20195364.3, filed Sep. 9, 2020, which is incorporated by reference herein in its entirety.

BACKGROUND

Technological Field

The disclosed technology relates to the technical field of analog in-memory computing devices for use as artificial intelligence inference accelerators, for example deep neural network inference accelerators.

Description of the Related Technology

State-of-the-art digital accelerators provide flexibility but consume significant amounts of power, which is prohibitive for small end-user devices such as smartphones, handheld computing devices, smart watches, tablets, and devices capable of IoT applications. In traditional digital accelerators, the data pertaining to trained machine-leaning models, for example the model network weights, is stored at a location that is physically separated from the locus of computation. Therefore, a low-latency, high-throughput and energy-efficient operability of these digital accelerators is hampered by the constant need to retrieve and transfer model data to the computational site.

In-memory computing techniques and devices have been proposed to overcome this issue by integrating model data storage, for example network weights, and computation in a single memory array.

In "In-Memory Computation of a Machine-Learning Classifier in a Standard 6T SRAM Array" by Zhang et al., IEEE Journal of Solid-State Circuits, Vol. 52, No. 4, April 2017, an array of standard 6T SRAM cells (128×128) is described which, when operated in SRAM mode, reads trained machine learning models represented as digital data into the array, activating one word line at the time. Contrarily, all word lines of the array are driven in unison to analogue voltages in classification mode, causing bit cell current flows in response in all the bit cells in parallel. One word line DAC per row of the array is used to generate the analog voltage levels based on digital features presented in a feature vector to the array. A weak, nonideal linear classifier is formed by each column of the array upon discharging of the corresponding differential bit line pair by the aggregated bit cell currents and thresholding of the differential bit line signal by a comparator. The column-wise weak classifiers need to be combined outside the array to achieve a strong classifier. Although features are represented as positive, five bit long binary numbers, model weights are restricted to take only the two values +1/−1. This two-level quantization regime for the model weights has the disadvantage that only weak classifiers can be computed in the memory array and that additional resources and computation is necessary to combine the weak classifiers outside the array. Moreover, the dynamic range of analog word line voltages is limited by the sub-threshold voltage operating condition of the access transistors in each SRAM cell, which is necessary to aggregate the sufficiently low (sub-threshold) bit cell currents of a large number of memory cells on a same read bit line during classification. However, a sub-threshold operating regime of the access transistors in compact SRAM cells leads to large variations in the bit cell currents. It would be desirable to have an energy-efficient in-memory computing device that is capable of more accurately reproducing model weights of a larger class of machine learning applications and for which variations across the ensemble of compute cells is less severe.

"RRAM-Based In-Memory Computing for Embedded Deep Neural Networks" by Bankman et al., 53rd Asilomar Conference on Signals, Systems, and Computers, Pacific Grove, Calif., USA, 2019, discloses dynamic voltage mode RRAM as an alternative to the performance-limited current mode operation. A disadvantage of this approach is that voltage drops on the read bit lines caused by the resistive divider network become critical for larger array sizes, posing scalability problems for future implementations. Furthermore, the maturity of RRAM technology has not yet advanced to a level comparable to existing memory technologies, for instance SRAM.

SUMMARY OF CERTAIN INVENTIVE ASPECTS

Embodiments of the disclosed technology provide scalable devices for energy-efficient and accurate in-memory computing for machine learning applications.

The above and additional objectives are accomplished by devices according to the disclosed technology. In particular, the above and additional objects are achieved by providing a compute cell in which a memory unit stores ternary weights and which includes a logic unit that is adapted to selectively enable conductive paths for the charging and/or discharging of at least one read bit line associated with the compute cell, wherein conductive paths are selected as a function of the respective signs of the stored ternary weight and a data input supplied to the compute cell. This has the advantage that trained model weights in machine learning applications can be stored more densely in the compute cells of an in-memory computing device, which favors higher throughputs. Moreover, a wider range of multiplication operations between data inputs and model weights is supported in a single compute cell, which boosts energy-efficiency.

In a first aspect the disclosed technology relates to a compute cell for in-memory multiplication of a digital data input X and a balanced ternary weight w. The compute cell includes a set of input connectors for receiving a corresponding set of modulated input signals representative of a sign (for example sgn(X)) and a magnitude (for example abs(X)) of the digital data input X. A memory unit of the compute cell is configured to store the balanced ternary weight. Furthermore, a logic unit of the compute cell is connected to the set of input connectors and the memory unit to receive the data input and the balanced ternary weight. The logic unit is adapted to selectively enable one of a plurality of conductive paths for supplying a first partial charge to a read bit line during a compound duty cycle T of the set of input signals if the data input and the balanced ternary weight both have a positive sign or both have a negative sign. The logic unit is also adapted to selectively enable a different one of the plurality of conductive paths for supplying a second partial charge to the same read bit line, or to a different read bit line, during the compound duty cycle T if the data input and the balanced ternary weight have opposite signs. Eventually, the logic unit is adapted to disable each of the plurality of conductive paths if at least one of the balanced ternary weight and the data input has zero magnitude, in order to prevent any supply of partial charges to the one or more read bit lines. The compound duty cycle T is indicative of the data input magnitude and a ratio of the first to the second partial charge is substantially negative one if the first and second partial charge are supplied to a same read bit line, and substantially positive one if the first and second partial charge are supplied to different read bit lines.

In embodiments of the disclosed technology, a single compute cell thus never supplies a first partial charge and a second partial charge during the same duty cycle, but only in sequence, during distinct cycles. Nevertheless, their ratio is +1 or −1 with respect to a same duration T of the compound duty cycles at which the first and second partial charge are supplied.

In embodiments of the disclosed technology, the memory unit can include a first storage cell and a second storage cell for storing two binary-valued weight signals that encode the balanced ternary weight w.

In embodiments of the disclosed technology, at least one of the first storage cell and the second storage cell may be, or consist of, one of the group consisting of: SRAM cell, DRAM cell, FeFET, flash transistor, ReRAM, phase-change memory. At least one of the first storage cell and the second storage cell may be, or consist of, a non-volatile storage element.

In embodiments of the disclosed technology, a current source may be inserted into one or several of the conductive paths that are selectively enabled by the logic unit. In particular embodiments of the disclosed technology, each one of the conductive paths that are selectively enabled by the logic unit includes, for example traverses, a corresponding current source. In yet other particular embodiments of the disclosed technology, a single current source is arranged such that it forms part of each conductive path.

The provision of the current source has the advantage that the rate at which the first and/or second partial charge is supplied to the corresponding read bit line can be limited, for example the compute cell pull-down/pull-up current can be limited, without introducing strong variations across an ensemble of compute cells. This enables a reliable and repeatable implementation of an in-memory computing device in which a large number of compute cells are connected to a same read bit line. Moreover, it allows to use the parasitic capacitance of the read bit lines to store the aggregated first and second partial charges supplied by a large number of compute cells when connected to a same read bit line, without requiring additional capacitance. A further advantage of a compute cell including one or more current sources is that a magnitude of the first and second partial charges that are supplied to the corresponding read bit lines during the compound duty cycle T is less susceptible to voltage swings on the read bit line(s) and/or to nonlinearities in the selection circuitry of the logic unit, for example transistor-based switches, because each current source is adapted to provide a constant-current of magnitude I during the compound duty cycle T, which is substantially independent of a voltage drop across that current source. This is approximately true for current sources operating in their voltage compliance range.

In embodiments of the disclosed technology, in which the compute cell includes a current source, an effective operating range of the compute cell may be defined via the range of read bit line voltages that are compatible with the partial charge supplying mechanism of the compute cell, for example for which a substantially constant compute cell current can be ascertained during the compound duty cycle T. Therefore, the effective operating range of this compute cell may range between the pre-charge level of a connectable read bit line, for example VDD, and the voltage level at which the current source enters the linear regime, for example $V_{bias,CS}-V_{T,CS}$, for nMOS-based implementations of the logic unit. Here, $V_{bias,CS}$ is the gate voltage bias that is supplied to a transistor-based current source, for example a long-channel transistor, of the compute cell and $V_{T,CS}$ is the threshold voltage.

It is a further advantage that no clamping scheme is required for the read bit lines to which the compute cells are connected in an in-memory computing device.

In embodiments of the disclosed technology, a current source may be provided as a long-channel transistor. The long-channel transistor is adapted to operate in saturation. A separate bias voltage may be applicable to a gate electrode of the long-channel transistor to control/adjust the constant-current magnitude I on the conductive path containing the long-channel transistor. This has the advantage that a magnitude of the supplied first and second charges of a compute cell can be scaled without deviation from a uniform compute cell layout.

In some embodiments of the disclosed technology, the current source(s) of the compute cell are adapted to automatically turn off if the conductive path, onto which the current source is placed, is disabled, and automatically turns on if the conductive path, onto which the current source is placed, is enabled.

In embodiments of the disclosed technology, the conductive paths for supplying the first and second partial charge do not extend into the memory unit. Decoupling the supply of the first and second partial charge from the storage mechanism of the balanced ternary weight does not endanger the stored balanced ternary weight of being erased inadvertently. Furthermore, this decoupling allows a rate at which the first and second partial charge is supplied, for example the compute cell pull-down/pull-up currents, to be determined independently of noise margin considerations relative to the memory unit.

According to some embodiments of the disclosed technology, received input signals are directly applicable to the gate electrodes of respective first transistor-based switches and the two binary-valued weight signal encoding the stored balanced ternary weight are directly applicable to the gate electrodes of respective second transistor-based switches. Pairs of serially-connected first and second transistor-based switches are provided as part of the logic unit to selectively enable each of the conductive paths. This has the advantage that received input signals do not need to be inverted. Furthermore, it is possible to provide a single current source that is shared by all the conductive paths in these embodiments of the disclosed technology.

According to some embodiments of the disclosed technology, received input signals are directly applicable to the source terminals of respective transistor-based switches, which are provided as part of the logic unit to selectively enable each of the conductive paths, and binary-valued weight signals encoding the stored balanced ternary weight are directly applicable to the respective gate electrodes of these switches. Thus, each one of the transistor-based switches is being controlled by the combined action of applied input signal and applied binary-valued weight signal. This has the advantage that a number of transistors per compute cell can be reduced, shrinking the area occupied, and the energy cost and leakage caused by such a compute cell. Furthermore, a built-up of a residual, input signal and weight-dependent tail charge on an internal node of the transistor-based switches is advantageously reduced, particularly useful in embodiments using a long-channel transistor as current source.

In some embodiments of the disclosed technology, a single received input signal is representative of unsigned (non-negative) data inputs and directly applicable to the gate electrode of a single input signal-controlled, transistor-based switch which is provided as part of the logic unit to selectively enable each of the conductive paths. Additionally, weight signal-controlled, transistor-based switches, which also form part of the logic unit to selectively enable each of the conductive paths, are series-connected to the single input signal-controlled switch. This has the advantage that a number of conductive paths that need to be selected is reduced, for example to two. Moreover, a number of transistors per compute cell can be reduced in this case.

In some embodiments of the disclosed technology, a single received input signal is representative of unsigned (non-negative) data inputs and directly applicable to the source terminals of weight signal-controlled, transistor-based switches, which are provided as part of the logic unit to selectively enable each of the conductive paths. This has the advantage that a number of conductive paths that need to be selected is reduced, for example to two. Moreover, a number of transistors per compute cell can be reduced in this case.

In some embodiments of the disclosed technology, the supplied first and second partial charge are of equal sign and charge/discharge two different read bit lines of a differential pair of read bit lines. In other embodiments of the disclosed technology, the supplied first and second partial charge are of opposite sign and charge/discharge a same read bit line.

In embodiments of the disclosed technology, a set of modulated input signal may relate to a set of analog, pulse-width modulated input signals with binary-valued amplitudes. Moreover, a set of input signals may be signaled differentially, for example the input signal and its complement are transmitted to the compute cell where they are received by a pair of complementary input connectors.

In another aspect the present disclosed technology relates to an in-memory computing device for matrix-vector multiplications in machine learning applications. It includes a plurality of compute cells according to embodiments of the first aspect, wherein the compute cells are organized into rows and columns of an array. The in-memory computing device further includes a plurality of read bit lines, each connecting logic unit outputs of compute cells arranged on a same column of the array, and a plurality of data lines, each connecting input connectors of compute cells arranged on a same row of the array. A data line driver of the in-memory computing device is operatively connectable to the plurality of data lines and configured to generate, for each digital data input supplied to the driver, a set of modulated binary-valued input signals which encode a sign of the supplied data input. A compound duty cycle T of the modulated input signals is indicative of a magnitude of the supplied data input. Furthermore, readout circuitry of the in-memory computing device is operatively connectable to the plurality of read bit lines and configured to detect an output signal on the read bit lines of each column, wherein each output signal is representative of the accumulated first and second partial charges supplied by the compute cells of that column in response to the set of input signals.

In embodiments of the disclosed technology, the data line driver may generate a set of pulse-width-modulated or pulse-count-modulated input signals.

In embodiments of the disclosed technology, compute cells of a same row and/or column of the array may be organized into groups and the in-memory computing device may further include control means for controlling a magnitude of the first and second partial charges supplied by the compute cells of a same group. The control means may include a voltage regulator for controlling a bias voltage delivered to a voltage-controlled current source that is included in the compute cell of each group of compute cells. Alternatively, or additionally, the control means may be adapted to control a unit time of the data line driver in respect of which the set of modulated input signals are generated, for example. a unit time for pulse widths in data line drivers using pulse-width modulation.

In embodiments of the disclosed technology, large array sizes of compute cells can be achieved. A storage capacity of the array of compute cells may be 1 Mb or more.

It is an advantage of embodiments of the disclosed technology that a zero-magnitude data input does not cause any activity in the compute cell, which significantly reduces the energy consumption relating to sparse vectors of data inputs. Moreover, a zero-magnitude data input may not cause any activity in the data line driver, which further reduces energy consumption.

It is an advantage of embodiments of the disclosed technology that the in-memory computing device requires only a low amount of energy in each operation, for example about 1.2 fJ/op or 2.4 fJ/MAC.

It is an advantage of embodiments of the disclosed technology that the in-memory computing device has a good energy efficiency and high throughput, for example more than 1000 TOPS/s/W, for example more than 2000 TOPS/s/W, and more than 5 TOPS/s, for example more than 20 TOPS/s, respectively.

Particular aspects of the disclosed technology are set out in the accompanying independent and dependent claims. Features from the dependent claims may be combined with features of the independent claims and with features of other dependent claims as appropriate and not merely as explicitly set out in the claims.

For purposes of summarizing the disclosed technology and the advantages achieved over the prior art, certain objects and advantages of the disclosed technology have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

The above and other aspects of the disclosed technology will be apparent from and elucidated with reference to the embodiment(s) described hereinafter.

BRIEF DESCRIPTION OF THE DRAWINGS

The disclosed technology will now be described further, by way of example, with reference to the accompanying drawings, in which.

Figure 1:
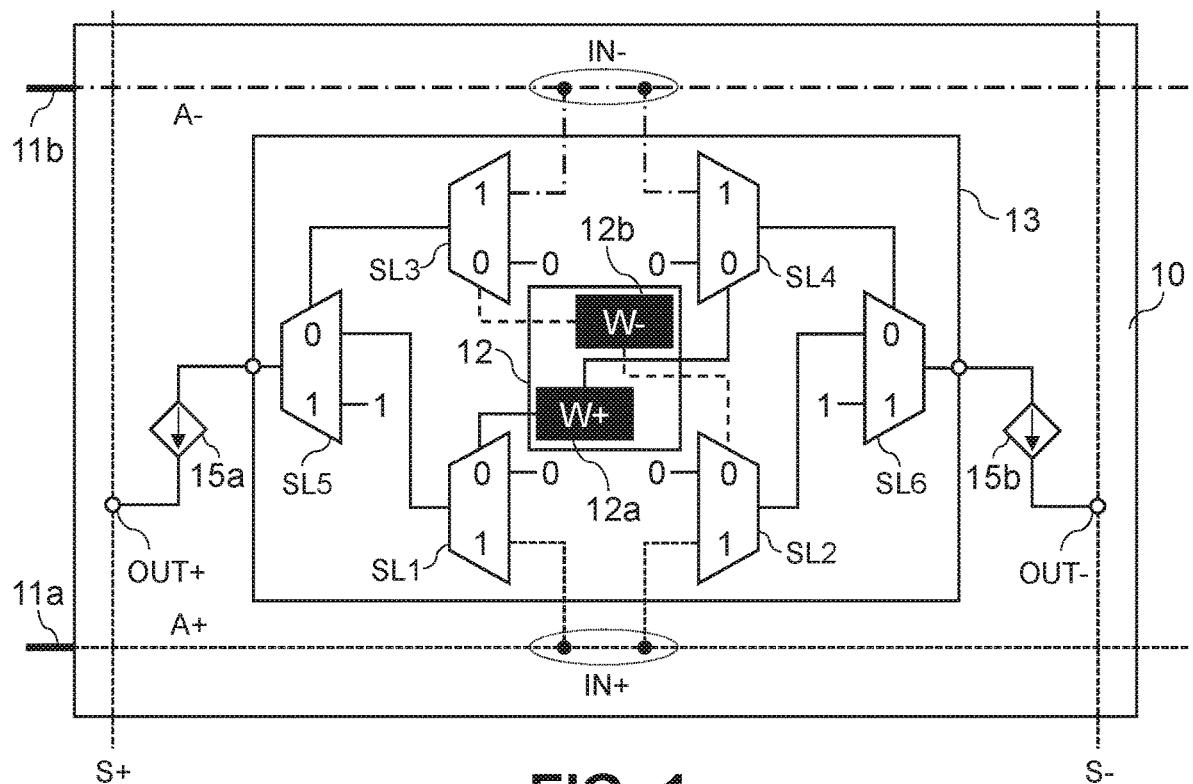
FIG. 1 depicts a compute cell for in-memory computing according to an embodiment of the disclosed technology.

The drawings are only schematic and are non-limiting. In the drawings, the size of some of the elements may be exaggerated and not drawn on scale for illustrative purposes. The dimensions and the relative dimensions do not necessarily correspond to actual reductions to practice of embodiments of the disclosed technology.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present disclosed technology will be described with respect to particular non-limiting embodiments and with reference to certain drawings.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosed technology described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosed technology, various features of the disclosed technology are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of the disclosed technology.

Furthermore, while some embodiments described herein include some but not other features included in other embodiments, combinations of features of different embodiments are meant to be within the scope of the disclosed technology, and form different embodiments, as would be understood by those in the art.

In the description provided herein, numerous specific details are set forth. However, it is understood that embodiments of the disclosed technology may be practiced without these specific details. In other instances, well-known methods, structures and techniques have not been shown in detail in order not to obscure an understanding of this description.

Definitions

In the context of the present disclosed technology, a set of modulated input signals conveys both a sign and a magnitude value of a digital data input. A set of input signals may consist of a single element, that is a single input signal, or may include more than one element, that is a plurality of input signals. In a sign-magnitude representation of the data inputs, positive data inputs are associated with a "+" sign, negative data inputs are associated with a "−" sign, and a zero-magnitude data input is assigned a zero sign for convenience, the latter allowing a more streamlined description of the logic operations relating to the sign of data inputs. It is understood that also unsigned data inputs, in contrast to signed data inputs, carry a sign information, even though this sign information is trivial, for example "+" or "0".

A digital data input to compute cells of an in-memory computing device, in the context of machine learning applications, corresponds for example to components (feature variables) of a feature vector at the input of a layer, such as, but not limited to, layer outputs of a preceding (hidden) layer that are fed as inputs to this next layer in a sequence of neural network layers and which corresponds to the layer-wise transformed feature vector applied to the input layer during inference. Often, these inputs are referred to as activations or activation inputs.

A modulated input signal refers to a signal that conveys the inputs by modulating the amplitude of a base signal in a way that specifically depends on the supplied data input, typically the magnitude thereof. Modulation of the base signal as a function of digitally presented inputs may be achieved through digital-to-analog converters (DACs) that are configured to pulse-count or pulse-width encode the digitally presented inputs to yield analog input signals.

A ternary number or numeral relates to a number that is expressed in a positional number system with base 3, using three basic digits and position-dependent weights that are natural powers of three. In analogy to bits, these basic digits of the ternary numeral system are termed trinary digits, or short "trits". In contrast to the standard (unbalanced) notation of the ternary numeral system, which uses the three non-negative basic digits 0, 1, 2, a balanced ternary numeral system uses both negative and positive basic digits that are symmetric with respect to zero, that is the three trinary digits (trits) −1, 0, 1, where −1 is sometimes denoted differently in literature, for example as a one with overbar or as "T". An advantage of the balanced ternary numeral system is that it does not need an additional minus sign to denote negative numbers. Every decimal or binary number can be represented in the balanced ternary system as a positionally ordered digit sequence comprising −1, 0, 1. Vice versa, every ternary number can be converted into a different numeral system, for example binary or decimal. For example, the following representations of the decimal number five hold in the binary, ordinary (unbalanced) and the balanced ternary numeral system: $5_{10}=101_2=12_3=1TT_{bal3}$ with T=−1.

Of particular interest in the field of computing and electronics is the binary-coded representation of ternary or balanced ternary numbers. As for binary-coded decimals, a binary encoding of decimals, binary-coded ternary numbers use a group of bits—usually two—to encode each trinary digit. For instance, the trits 0, 1 and 2 (−1 or T in balanced ternary) are encoded by the two-bit combinations 00, 01 and 10 respectively. Although this leads to a less dense representation of the balanced/unbalanced ternary number, for example for storage in memory, this binary-encoded representation of balanced/unbalanced ternary numbers is useful for interfacing the vast majority of digital circuitry that is based on binary logic.

An embodiment of the disclosed technology will first be described in general terms with reference to FIG. 1. As depicted in FIG. 1, a compute cell 10 for in-memory computing tasks frequently encountered in machine-learning applications, including but not limited to matrix-vector multiplication (MVM) or multiply-and-accumulate (MAC), includes:
- a set of input connectors, for example a set comprising a first input connector 11a and a second input connector 11b, for receiving a sign and a magnitude of a digital data input via a corresponding set of modulated input signals representative of that data input, for example via a set of two pulse-modulated analogue input signals "A+" and "A−",
- a memory unit 12 which is configured to store a balanced ternary digit (for example a balanced trit $W_{bal3}$) as a binary-encoded signal, for example $W_{bal3}:=(W+,W-)_2$, and
- a logic unit 13 connected to the set of input connectors 11a-b and the memory unit 12, which logic unit 13 is configured to:
  receive the respective sign and magnitude of the data input represented by the set of input signals and of the stored balanced weight trit, and
  either selectively enable only one of a plurality of conductive paths as a function of the respective signs of the balanced weight trit and of the data input, for transferring a partial charge to a read bit line S+/S− connectable to an output OUT+/OUT− of the logic unit, if none of the balanced weight trit and data input is zero (that is has zero magnitude),
  or disable all the conductive paths if at least one of the balanced weight trit and data input is zero (that is has zero magnitude), in order to prevent any partial charge transfer to one or more read bit lines S+/S− connectable to respective one or more outputs OUT+/OUT− of the logic unit.

More specifically, the logic unit 13 is adapted to enable one of the conductive paths such that a first partial charge is supplied to one read bit line during a compound duty cycle T of the set of input signals if the balanced trit and the data input have equal sign, and to enable a different one of the conductive paths such that a second partial charge is supplied to the same one or a different one read bit line during a compound duty cycle of the set of input signals if the balanced trit and the data input have opposite sign, wherein the compound duty cycle of the set of input signals is indicative of the data input magnitude. In that regard the set of modulated input signals act like a set of control signals for which a modulation of the signal amplitudes controls a flow of charge away from a read bit line and into the compute cell, or vice versa. Furthermore, a ratio r of the supplied first partial charge Q1 to the supplied second charge Q2, r=Q1/Q2, is substantially plus one, that is r=+1, if different read bit lines S+, S− are charged/discharged during a same time period T (for example same data input magnitude) via corresponding different logic unit outputs OUT+, OUT− with respect to equal and opposite signs for the balanced trit and data input, respectively. In contrast, this ratio r is substantially minus one, that is r=−1, if the same read bit line S is charged/discharged during a same time period T (for example same data input magnitude) via a same corresponding logic unit output OUT with respect to equal and opposite signs for the balanced trit and data input, respectively.

For convenience, a zero-valued sign may be associated with a zero-magnitude data input or stored balanced trit. Then the respective sign of the data input and balanced trit are obtainable by simply applying thereto the sign-function "sgn", that is sgn(z)=+1 if z>0, 0 if z=0, and −1 if z<0. Assigning a zero-valued sign to the zero-magnitude data input or stored balanced trit simplifies the selection rules for the conductive paths followed by the logic unit: selectively enable one of the conductive paths if the product P of the signs of balanced trit $W_{bal3}$ and data input X, P=sgn($W_{bal3}$)*sgn(X), is positive P=+1, selectively enable a different one of the conductive paths if this product P is negative P=−1, and disable all the conductive paths if this product P is zero P=0. In embodiments of the disclosed technology the enabled one of the conductive paths for positive products P=+1 is typically a different one for the two cases of having signs of balanced trit $W_{bal3}$ and data input X that are both positive, that is sgn($W_{bal3}$)=sgn(X)=+1, or both negative, that is sgn($W_{bal3}$)=sgn(X)=−1, although a portion of these two conductive paths may overlap. Likewise, the enabled one of the conductive paths for negative products P=−1 typically differs for the two cases of having signs of balanced trit $W_{bal3}$ and data input X that are opposite with a positively signed balanced trit, that is sgn($W_{bal3}$)=−sgn(X)=+1, or opposite with a negatively signed balanced trit, that is sgn($W_{bal3}$)=−sgn(X)=−1, yet a portion of these two conductive paths may overlap.

The conductive paths may extend, at least partially, through optionally provided current sources of the compute cell, but are isolated from the storage cells 12a, 12b of the memory unit. In the embodiment of FIG. 1, for instance, two optional current sources 15a, 15b are provided, and each one is arranged between an output OUT+/OUT− of the logic unit 13 and the corresponding output node of selection circuitry SL5, SL6 of the logic unit 13. A differential pair of read bit lines, S+ and S−, is thus connectable to the corresponding pair of logic unit 13 outputs OUT+, OUT−, such that the two current sources 15a, 15b are situated closest to the read bit lines S+, S−. Providing the current sources 15a, 15b has the additional advantage that the magnitude of the supplied first and second partial charges Q1, Q2 can be controlled by adjusting the amount of current I that is sunken or sourced during the compound duty cycle T of the set of input signals, for example by virtue of the relation Q=I*T. This amount of sourced/sunken current I can be controlled by design of the current source, or may be actively adjustable via a control/bias voltage that is applicable to each current source 15a, 15b. A compliance voltage range for the current sources 15a, 15b can be chosen in such a way that the current sources 15a, 15b turn on and off automatically as soon as a conductive path therethrough is selectively enabled and disabled respectively. This may be achieved by an appropriately setting of the control/bias voltage applied to the current sources 15a, 15b, for example such that an over drive voltage of the current source is smaller than the positive power supply voltage VDD of the logic unit, lowered by the characteristic threshold voltage $V_{T,sel}$ of transistor-based switches in the selection circuitry of the logic unit: $V_{bias,CS} - V_{T,CS} < VDD - V_{T,sel}$. Besides, the amount of sourced/sunken current I is approximately independent of voltage changes across the current source 15a, 15b, for example is insensitive, to first order, to voltage variations on a connected read bit line (for example large-scale voltage swing). This is advantageous for the design of an in-memory computing device including an array of compute cells, in which the scaling behavior of groups of compute cells, for example compute cells belonging to a same array column, should be as predictable as possible. The current magnitude I may be advantageously limited to values, for example below 1 μA, which allow a larger number of compute cells to be connected to a same set of read bit lines, for example up to 1024 compute cells or more per array column.

The memory unit 12 may include a first storage cell 12a adapted to receive and hold a first binary signal, for example a weight bit W+ in FIG. 1, and a second storage cell 12b adapted to receive and hold a second binary signal, for example a weight bit W− in FIG. 1, wherein a combination of the first and second binary signal respectively held in the first and second storage cell 12a, 12b represents the stored balanced trit of the memory unit 12. For instance, the balanced trit $W_{bal3}=1$ may be held as the binary-coded ternary (BCT) signal $W_{bal3}=(1\ 0)_{BCT}$ for which the first binary signal ascertains the first bit value, that is W+=1, and the second binary signal ascertains the second bit value, that is W−=0. The two other cases correspond to $W_{bal3}=T=(0\ 1)_{BCT}$ for which W+=0 and W−=1 and $W_{bal3}=0=(0\ 0)_{BCT}$ for which W+=0 and W−=0. It is noted that a different binary-encoding scheme may be used to encode the balanced trit as two binary signals, for example the complement of the previous BCT-encoding may be used. The storage cells 12a, 12b may be implemented by electronic storage circuits that are known in the art, for example SRAM cells (for example standard 6T-SRAM cells), DRAM cells, DRAM gain cells, IGZO-based DRAM gain cells, or using Ferro-FET/FeFET, flash transistor, phase-change memory (PCM), magneto-resistive RAM (MRAM), resistive RAM, etc. Having regard to FeFET or flash transistor-based storage cells, a digital voltage level may be obtained from a center point of a resistive divider comprising two series-connected, complementary FeFET or flash transistor elements. Although not shown explicitly in the drawings, the skilled artisan will appreciate that the binary signals used to encode the balanced trit may be written into and/or read from the memory unit 12 by means of additional word line(s) for accessing the storage cells of the memory unit, as well as weight data write and/or read bit lines. In embodiments of the disclosed technology that rely on non-volatile storage cells, for example FeFET, PCM or MRAM, the weight data may be written into the storage cells of the memory unit at or after manufacture, and not altered afterwards. Therefore, the additional word line(s) for read/write access of weight data and the weight data write and/or read bit lines may not always be required. Nonetheless, a regular writing of the weight data into non-volatile storage cells also remains a valuable option, because it allows different machine learning models to be implemented on the same hardware. In particular embodiments of the disclosed technology, the storage cells 12a and 12b of the memory unit 12 may be provided in such a way that in addition to the stored binary-valued weight signal, for example W+ or W−, also the complement thereof is stored by default, for example in SRAM cells both the written bit value and its complement are accessible. This is useful in embodiments of the disclosed technology in which the logic unit of the compute cell also uses the complements of the stored binary-valued weight signals W+,W− which encode the stored balanced ternary weight $W_{bal3}$. Yet it is possible to generate these complements solely based on the stored binary-valued weight signals W+,W− if needed in other embodiments of the disclosed technology, for example via fan-out and inverters.

A balanced trit held by the memory unit 12 is representative of a weight coefficient, for example a weight coefficient of a weight matrix that is to be multiplied with a vector of data inputs when performing MVM in the context of machine-learning applications. It is an advantage of embodiments of the disclosed technology that the balanced trit of the memory unit supports hardware implementations of trained machine-learning models for which trained model data is quantized according to three quantization levels, for example ternary (three-valued) model weights of a trained ANN. This allows for more accurate model predictions during inference. A further advantage, which will be described in more detail further below in the description, resides in the fact that, at the array level, where balanced trits are stored in the memory units of the respective compute cells, a combination and appropriate weighting of the pull-down/pull-up strengths of two or more compute cells allow for a dense implementation of trained model data obtained with an even more precise quantization scheme, for example a multi-bit quantization scheme distinguishing four or more levels. In such dense and more precise implementations the quantized (trained) model data is converted into a ternary/balanced ternary number representation and the resulting trits are assigned to the group of two or more compute cells with correspondingly power-of-three weighted pull-down/pull-up strength. The choice of providing a power-of-three weighted pull-down/pull-up strength is not a limiting one; as discussed further below with reference to an array of compute cells, also a power-of-two or a power-of-one weighting can be realized. Here, an ANN includes, but is not limited to, recurrent neural networks, feedforward neural networks, deep neural networks, and convolutional neural networks.

In the embodiment of FIG. 1, the set of modulated input signals A+, A− may be transmitted over data bit lines to which the input connectors 11a-b of the compute cell 10 are connectable. In the present embodiment, the transmission of the modulated input signals A+, A− to the input connectors of the compute cell is single-ended. However, differential transmission using two complementary signals per input signal is also possible, as will be explained hereinbelow. As mentioned, the set modulated input signals A+, A− conveys both a sign and a magnitude of a supplied data input. This data input may be, without being limited thereto, an activation input produced by a neuron in an ANN or a feature (data entry) of a feature vector presented to an input layer of an ANN. The magnitude of the communicated data input can be equal to zero, in which case both input signals assume a constant signal level without modulation, usually a logic Low level to avoid charging of the data bit lines. Contrarily, a non-zero magnitude of the data input is time-encoded in the set of input signals, for example by modulating a (compound) duty cycle T of the input signals. A modulated duty cycle may correspond to the pulse width of a pulse-width modulated (PWM) input signal and a compound duty cycle T=M*dT may correspond to the total on-period, or accumulated pulse width, of a train of pulses of duration dT if pulse-number encoding is used to transmit the magnitude M of the data input by the set of modulated input signals. Furthermore, the set of modulated input signals A+, A− does not describe two input signals which are entirely unrelated. In the absence of pulse-amplitude modulation, one way of conveying also the sign of the data input X—which may be conveniently expressed via the sign-function (as described above) as sgn(X)—is to encode this three-valued sign information, for example represented as a balanced trinary digit, as a set of two binary variables A+, A−, wherein each of the binary variables takes only one out of two allowed values (logic Low, logic High) at a time. Consequently, the same binary-encoding scheme of balanced trits (BCT) that has been applied to the stored balanced trit of the memory unit 12 is also applicable to the sign value of the data input. This means that a "+" sign of the data input X can be represented by selecting a High logic level for the first input signal A+ and a Low logic level for the second input signal A− of the set of input signals during the time T of the compound duty cycle, because sgn(X)=1=(1 0)$_{BCT}$ and abs(X)=M∝T. Similarly, one has sgn(X)=−1=(0 1)$_{BCT}$ which means that a "−" sign of the data input X can be represented by selecting a Low logic level for the first input signal A+ and a High logic level for the second input signal A− of the set of input signals during the time T of the compound duty cycle. Eventually, for a zero-magnitude data input abs(X)=0 the compound duty cycle has a zero-time duration T=0 and both the first and second input signals remain at their Low logic level during the transmission time window, for example clock phase, assigned to the input data communication, thereby automatically fulfilling sgn(X)=0=(0 0)$_{BCT}$. Of course, the other binary encoding of the data input sign, when represented as a balanced trit, are possible, for example the complementary encoding with respect to the BCT-scheme just discussed. Digital data inputs may be supplied not only as signed binary numbers, but also as a number converted into a balanced ternary representation. This means that for each digital data input consecutive trinary digits are serially transmitted as a set of binary-encoded input signals to the input connectors of the compute cell. In a balanced ternary representation of the digital data inputs, information pertaining to both the magnitude and the sign of the data input are present in each trit. This allows a denser representation of the data inputs, for example less pulses in digit-wise transmission of the data inputs in which the number of pulses or the pulse width is scaled according to the digits position. In consequence, wider pulses can be used and more accurate outputs obtained on the read bit lines.

Embodiments of the disclosed technology are not limited to a set of input connectors comprising two elements, for example a first and a second input connector 11a-b as shown in FIG. 1. For example, the set of input connectors may include a single element, that is a single input connector, and the corresponding set of modulated input signals only a single input signal. A compute cell having only a single input connector is well-suited for applications in which only non-negative input data is generated and communicated to the compute cell. In such a case only a single pulse-modulated input signal A is sufficient to transmit both the sign and the magnitude of the data input. Nonetheless, a second input connector may be added to form a pair of complementary, for example differential, input connectors and the corresponding set of input signals, in addition to the pulse-modulated input signal A, also includes the complement/A of the pulse-modulated input signal A. Differential transmission of the input data has the advantage that common mode noise is rejected, but requires an additional data bit line. That said, differential signaling may also be used with respect to the embodiment of FIG. 1, in which case the number of input connectors is doubled, that is the set of input connectors comprises four elements, for example a first and second input connector forming a first pair of complementary input connectors for receiving a first set of complementary input signals, for example first modulated input signal A+ and its complement /A+, and a third and fourth input connector forming a second pair of complementary input connectors for receiving a second set of complementary input signals, for example second modulated input signal A− and its complement/A−.

A digital modulation technique, for example pulse-width modulation or pulse-count-modulation by a digital-to-analogue converter, may be used to ascertain that the magnitude of a supplied digital data input is accurately time-encoded in the one or more input signals received by the compute cell 10, for example time-encoded as the compound duty cycle T or the compound on-time T (for example total time where input signal level is logic High) of the one or more input signals relative to a reference period, for example a clock phase or a fraction thereof. Similarly, selection circuitry, which may be part of the digital-to-analogue converter output, may be used to ascertain that also the sign of the supplied digital data input is accurately conveyed by the one or more modulated input signals by selectively enabling or disabling their transmission on respective data bit lines, for example a set of data bit lines that is operatively connectable to the corresponding set of input connectors of the compute cell.

In the embodiment of FIG. 1, the selection rules obeyed by the logic unit 13 for selectively enabling one of a plurality of conductive paths, or for disabling all the conductive paths, as a function of the respective signs of the stored balanced trit and the communicated data input, are implemented by suitable selection logic elements, for example combinational selection circuitry SL1 to SL6. Zeros and ones that are input to the selection circuitry SL1 to SL6 correspond to logic levels, for example logic Low and High. It is noted that the selection circuitry SL1 to SL6 are depicted as 2-to-1 multiplexers only for the purpose of illustrating their functional role in the logic unit 13. Although this reflects one possible implementation of selection circuitry SL1 to SL6, the ordinarily skilled person in the art is aware that various other implementations exist, which all lead to the same overall logic behavior of the logic unit 13. There are four conductive paths that are controlled by the selection circuitry SL1 to SL6 of the logic unit 13 and that can be selectively enabled or disabled, based on the binary-valued input signals A+, A− and the binary-valued weight signals W+, W− respectively representing the signs of the transmitted data input and the stored balanced trit. A first conductive path, if enabled, extends between IN+ and OUT+ and allows a first partial charge to be supplied to a first read bit line S+ that is connected to the logic unit output OUT+ and the current source 15a. Furthermore, a second conductive path, if enabled, extends between IN+ and OUT− and allows a second partial charge to be supplied to a second read bit line S− that is connected to the logic unit output OUT− and the current source 15b. In the present embodiments it is assumed that the first and second read bit lines S+, S− form a differential read bit line pair and that a pre-charge level for both read bit lines S+, S− corresponds to a logic Low level. These assumptions may not hold for other embodiments, as will be demonstrated further below. Moreover, the two current sources 15a, 15b can act as constant-current sources in their compliance voltage range. This means that no current is provided by the current sources 15a, 15b if the compliance voltage range is not reached, for example the current sources 15a, 15b are turned off. If output nodes of the selection circuitry SL5, SL6 in the logic unit 13 are adopting a high-impedance state or have a voltage level that is approximately equal to, or lower than, the voltage level of the read bit lines, the compliance voltage range is not reached and the current sources 15a, 15b are inactive. As a result, the current sources 15a, 15b provide a constant current only if the voltage signal at the output nodes of the selection circuitry SL5, SL6 ascertains a logic High. It is noted again that the current sources 15a, 15b are only optional and may be absent in other embodiments of the disclosed technology, for example where the selection circuitry of the logic unit are directly connectable to the read bit lines.

The first and second partial charge supplied via the enabled first and second conductive path, respectively, thus have the effect of charging the read bit lines S+ and S− as long as the input signal A+ ascertains a logic High level at IN+, for example during the compound duty cycle T of the input signal A+. Whether the first or second conductive path is enabled, or both are disabled, depends on the binary-valued (weight) storage signals W+, W−. By virtue of the relation Q=I*T, the first and second partial charge are substantially equal, provided that the charge flow rates, that is the constant current magnitudes I, through the outputs OUT+, OUT− of the cell 10 are substantially equal. This condition may be approximately fulfilled, up to design variations, by using a symmetric design of the selection circuitry SL1 to SL6 relative to the two logic unit outputs OUT+, OUT− and inputs IN+, IN−, or by providing matched current sources 15a, 15b with the advantage that the impact of design variations can be further reduced. In analogy to the above-described first and second conductive path, there exist a third and a fourth conductive path which, when enabled, also allow the respective read bit lines S+, S− to be charged. More specifically, the third conductive path, if enabled, extends between IN− and OUT+ and allows the same first partial charge to be supplied to the first read bit line S+ via the current source 15a. Furthermore, the fourth conductive path, if enabled, extends between IN− and OUT− and allows the same second partial charge to be supplied to the second read bit line S− via the current source 15b. In contrast to enabled first and second conductive paths, enabled third and fourth conductive paths have the effect of charging the read bit lines S+ and S− as long as the input signal A− ascertains a logic High level at IN−, for example during the compound duty cycle T of the input signal A−. Whether the third or fourth conductive path is enabled, or both are disabled, depends on the binary-valued (weight) storage signals W+, W−.

It is thus understood from the study of the compute cell 10 in FIG. 1 that the selection circuitry SL1 to SL6 of the logic unit 13, and the ensemble of conductive paths controlled thereby, function in the same way as a pull-up network of a dynamic logic gate with respect to the two connectable read bit lines S+, S− whose associated parasitic capacitances are conditionally charged during the evaluation phase. However, the logic unit 13 of the compute cell 10 is not evaluated upon reception of a clock phase, but uses the modulated input signal A+ and A− to toggle the output voltages at the logic unit outputs OUT+, OUT−.

Table I summarizes all the possible configurations of the set of input signals A+, A− and binary-valued weight signals W+, W−, and the corresponding logic levels obtained at the logic unit outputs OUT+ and OUT−, in a truth table. As the signs of the data input X and the stored ternary weight W have only three distinct values, that is +1, 0, −1 or T, one combination of two bits is never used to represent these signs, for example the combination $(1\ 1)_{BCT}$ is not defined for the set of input signals (A+, A−) and the set of weight signals (W+, W−) in the present embodiment. It can be seen that the following relationship always holds for the output states, which are also denoted OUT+ and OUT− for convenience: (OUT+)=(A+)*(W+)+(A−)*(W−) and (OUT−)=(A+)*(W−)+(A−)*(W+). Furthermore, the difference of outputs, (OUT+)−(OUT−)=[(A+)−(A−)]*[(W+)−(W−)], is well-defined in balanced ternary logic and, by comparison with the entries of the first two columns of Table I, can be rewritten as $OUT_{bal3}:=(OUT+)-(OUT-)=X_{bal3}*W_{bal3}$. This demonstrates that the output of the logic unit 13 is indicative of the product of the respective signs of the stored ternary weight and the supplied data input. As the output of the logic unit causes a substantially constant current I to flow through the corresponding output nodes 14a, 14b of the compute cell, the integration of this current over the time T of the compound duty cycle of the set of input signals yields the resulting difference in supplied first and second partial charges, for example ΔQ=Q1−Q2=[(I+)−(I−)]*T. Since the duty cycle T is proportional to the magnitude of the supplied data input, that is T∝abs(X), one has $\Delta Q \propto X_{bal3}*W_{bal3}*abs(X)=X*W_{bal3}$, and it is concluded that the compute cell 10 is indeed adapted to compute a partial product of a matrix-vector product. Arranging a plurality of compute cells 10 in an array such that compute cells of a same column of the array are all connected to the same set of read bit lines will lead to an accumulation of the supplied partial charges ΔQ on the set of read bit lines each time a vector of data inputs has been supplied to the rows of the array, whereby the partial products of each compute cell are accumulated to give the complete outcome of the column-wise performed MAC operations underlying the matrix-vector multiplication.

TABLE I

Truth table for the primary inputs A+, A−, W+, and W− of the logic unit of the embodiment of FIG. 1.

| sgn(X) or $X_{bal3}$ | sgn(W) or $W_{bal3}$ | A+ | A− | W+ | W− | OUT+ | OUT− |
|---|---|---|---|---|---|---|---|
| 1 | 1 | 1 | 0 | 1 | 0 | 1 | 0 |
|  | 0 |  |  | 0 | 0 | 0 | 0 |
|  | −1/T |  |  | 0 | 1 | 0 | 1 |
| 0 | 1 | 0 | 0 | 1 | 0 | 0 | 0 |
|  | 0 |  |  | 0 | 0 | 0 | 0 |
|  | −1/T |  |  | 0 | 1 | 0 | 0 |
| −1/T | 1 | 0 | 1 | 1 | 0 | 0 | 1 |
|  | 0 |  |  | 0 | 0 | 0 | 0 |
|  | −1/T |  |  | 0 | 1 | 1 | 0 |

Figure 2:
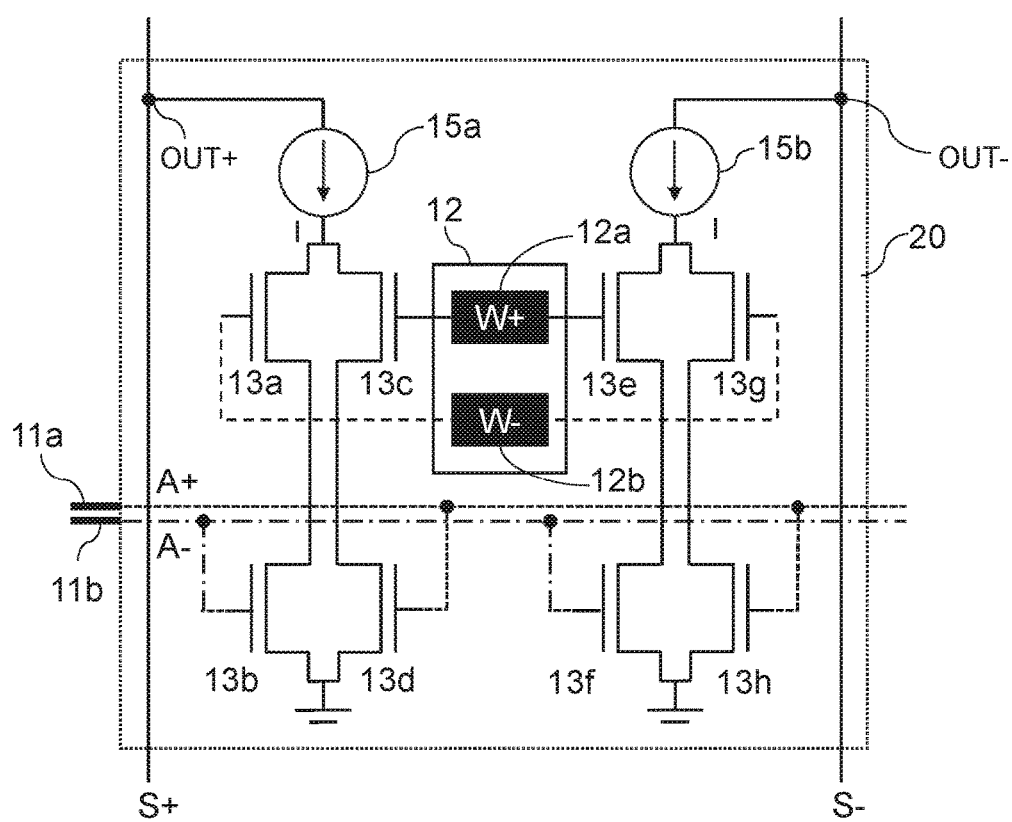
FIG. 2 shows a compute cell for in-memory computing according to another embodiment of the disclosed technology, providing more details on the logic unit implementation.

With reference to FIG. 2, a particular transistor-based implementation of the selection circuitry of the logic unit in FIG. 1 will now be described for a compute cell 20 according to an embodiment of the present disclosed technology. The logic unit 13 of compute cell 20 includes four transistor pairs 13a-b, 13c-d, 13e-f, and 13g-h, wherein the transistors of each pair are connected in series such that a source terminal of the first transistor of the pair (for example transistors 13 a, c, e, g) is coupled to a drain terminal of the second transistor of that pair (for example corresponding transistors 13 b, d, f, h). Moreover, each transistor pair is connected between one of the two current sources 15a, 15b and logic ground supply. In particular, the first transistors 13a, 13c of the first and second transistor pair have their drain terminals connected together and coupled to the current source 15a. Similarly, the second transistors 13e, 13g of the third and fourth transistor pair have their drain terminals connected together and coupled to the current source 15b. The source terminals of the second transistors of each pair (for example transistors 13 b, d, f, h) are connected to logic ground supply. The gate electrodes of the second transistors 13d, 13h of the second and fourth transistor pair are configured to receive the first input signal A+ supplied at the first input connector 11a, whereas the gate electrodes of the second transistors 13b, 13f of the first and third transistor pair are configured to receive the second input signal A− supplied at the second input connector 11b. Furthermore, the gate electrodes of the first transistors 13c, 13e of the second and third transistor pair are configured to receive the first binary weight storage signal W+ provided by the first storage cell 12a of the memory unit 12, and the gate electrodes of the first transistors 13a, 13g of the first and fourth transistor pair are configured to receive the second binary weight storage signal W− provided by the second storage cell 12b of the memory unit.

A conductive path is associated with each one of the transistor pairs of FIG. 2, and each conductive path is selectively enabled only if the supplied signals at the gate electrodes of each transistor of the associated transistor pair ascertain a logic High level (in the case of n-type transistors considered at presence). For example, a first and a second conductive path are associated with the transistors 13a-b of the first transistor pair and the transistors 13c-d of the second transistor pair respectively. The input variables W−, A− relative to the first conductive path are inputs to a dynamic NAND gate formed by the transistors 13a-b of the first transistor pair, and the input variables W+, A+ relative to the second conductive path are inputs to a dynamic NAND gate formed by the transistors 13c-d of the second transistor pair. As a result, a first output OUT+ of the logic unit 13 is actively pulled Low, and a first read bit line S+ discharged by a first partial charge Q1=T*I during a compound duty cycle T of the set of input signals A+, A−, only if (/OUT+)=(W+ AND A+) OR (W− AND A−) is true, where /OUT+ is the complement of OUT+. Similarly, it can be shown that a second output OUT− of the logic unit 13 is actively pulled Low, and a second read bit line S− discharged by a second partial charge Q2=T*I=Q1 during a compound duty cycle T of the set of input signals A+, A−, only if (/OUT−)=(W+ AND A−) OR (W− AND A+) is true. This is in agreement with the results demonstrated in respect of the embodiment of FIG. 1, with the only difference that the read bit lines S+, S− are discharged rather than charged. In particular, the results of Table I are also applicable to the embodiment of FIG. 2, with the proviso of substituting the logic variables OUT+ and OUT− of the penultimate and the ultimate column by their complements /OUT+ and /OUT− to account for the n-type (negative) logic used and interpreting a logic '0' in these columns as a floating state of the logic unit outputs at the voltage level as the corresponding read bit line S+ or S− (originally pre-charged to a logic High level).

In embodiments of the disclosed technology which rely on transistor to implement the selection circuitry of the logic unit, the provided transistors can act like switches with low current leakage and high input impedance at the control electrode (for example gate). Input signals W+, W−, A+ and A−, when applied to the gate electrodes of these transistors so as to close the switch, typically have a sufficient voltage amplitude, well above the transistor threshold voltage. Exemplary transistors include nMOS and pMOS-type FETs in general, and may have a particular type of geometry, for example FinFETs or planar transistors. A transistor channel material my include silicon or IGZO, such as for example in ultralow-leakage IGZO-based TFTs. Although the embodiment of FIG. 2 is based on n-type transistor logic, for example nMOS-FETs, this does not constitute a limitation of the disclosed technology. The skilled person will appreciate that the pull-down effect of each enabled conductive path in the embodiment of FIG. 2 can be substituted by a complementary pull-up effect if the n-type transistors are replaced by their p-type counterparts and a logic power supply is changed from ground, or VSS, to VDD. A pre-charge state of the read bit lines may be changed accordingly.

Figure 3:
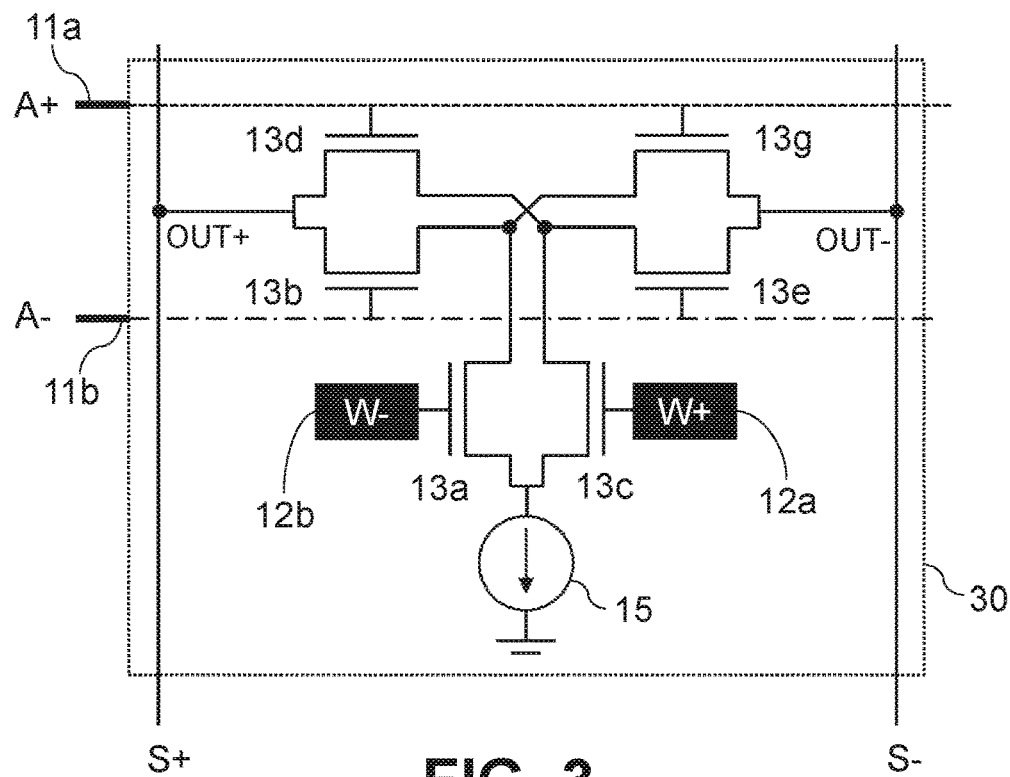
FIG. 3 shows a compute cell for in-memory computing according to an embodiment of the disclosed technology, in which a single current source is shared by all conductive paths.

FIG. 3 is an illustrative embodiment of a compute cell 30, which is a variant of the embodiment shown in FIG. 2. It differs from the compute cell 20 in that the second transistors 13a, 13c of the first and second transistor pair are also used as the second transistors of the third and fourth transistor pair. This implies that the source terminals of the first transistors 13b, 13g of the first and third transistor pair are connected, as are the source terminals of the first transistors 13d, 13e of the second and fourth transistor pair. The sharing of transistors has the advantage that a number of transistors required for the logic unit 13 of the compute cell can be reduced by two. Besides, the order in which the input variables are applied to the gate electrodes of the transistors of each transistor pair has been swapped with respect to the embodiment of FIG. 2, that is the binary weight storage signals W+ and W− are supplied to the respective second transistors of the transistor pairs, and the input signals A+, A− are supplied to the respective first transistors of the transistor pairs.

Moreover, a single current source 15 is connected between the source terminals of the transistors 13a, 13c and logic ground power supply in the compute cell 30, instead of providing two distinct current sources as shown in FIG. 2. This reduces the number of current sources by one, but has the effect that an unintended residual charge is removed from the read bit lines S+, S− and, being directed through one of the first transistors 13b, 13d, 13e, or 13g operating as a closed switch, starts accumulating on the parasitic drain capacitances of transistor 13a or 13c even if a binary weight signal W+ and/or W− is zero; an effect which is avoided in the embodiment of FIG. 2. However, this unintended effect can be compensated at the application level, for example by accounting for the residual charge transfer when training a machine learning model to run on the specific hardware, or at the hardware level, for example by adding dummy compute cells to balance the number of weights stored on compute cells belonging to a same set of read bit lines.

Figure 4:
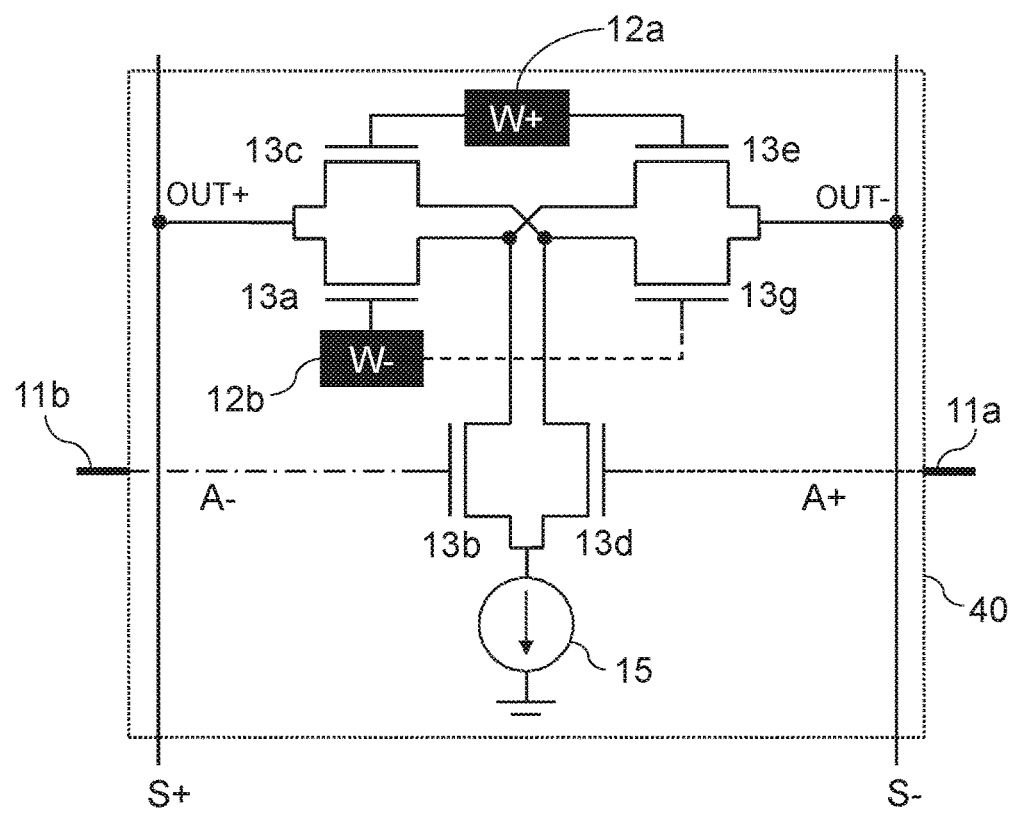
FIG. 4 is a variant of the compute cell in FIG. 3, modifying the order in which the input signal and the weight signal are applied along each conductive path.

FIG. 4 shows a modified compute cell 40 that is based on the compute cell of FIG. 3. The modified compute cell 40 is obtained from the compute cell 30 of FIG. 3 by restoring the original order of FIG. 2 in which the input variables are applied to the gate electrodes of the transistors of each transistor pair. In particular, the binary weight storage signals W+ and W− are supplied to the respective first transistors 13c, 13e and 13a, 13g of the transistor pairs, and the input signals A+, A− are supplied to the respective second transistors 13d, 13b of the transistor pairs. This modification achieves that no residual charge is inadvertently taken from the read bit lines S+, S− when a transistor controlled by one of the input signals A+, A− is switched on, even though the weight signal W+ or W− with regard to this conductive path is zero. A side effect of this modification is that the capacitance of the read bit lines S+, S− becomes dependent on the number of non-zero weights, $W_{bal3}<>0$, presently stored in compute cells connected to a same set of read bit lines. As explained before, this effect can be accounted for while training the machine learning model or compensated in hardware by the addition of dummy cells. The embodiment of FIG. 3 and FIG. 4 can be further modified by removing the current source 15 entirely and connecting the source terminals of the transistors 13b, 13d directly to logic ground power supply.

Figure 5:
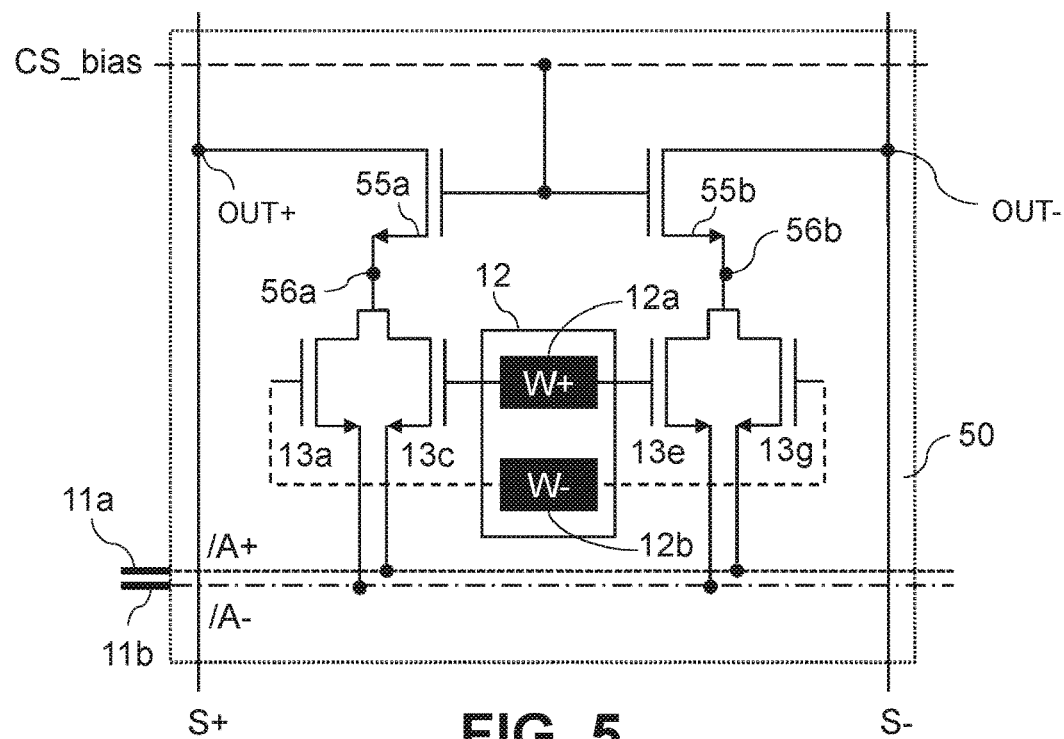
FIG. 5 shows a compute cell for in-memory computing according to an embodiment of the disclosed technology, in which the input signals are directly applicable to source terminals of logic unit transistors for selectively enabling the conductive paths and a common bias voltage controls each one of the two current sources.
Figure 6:
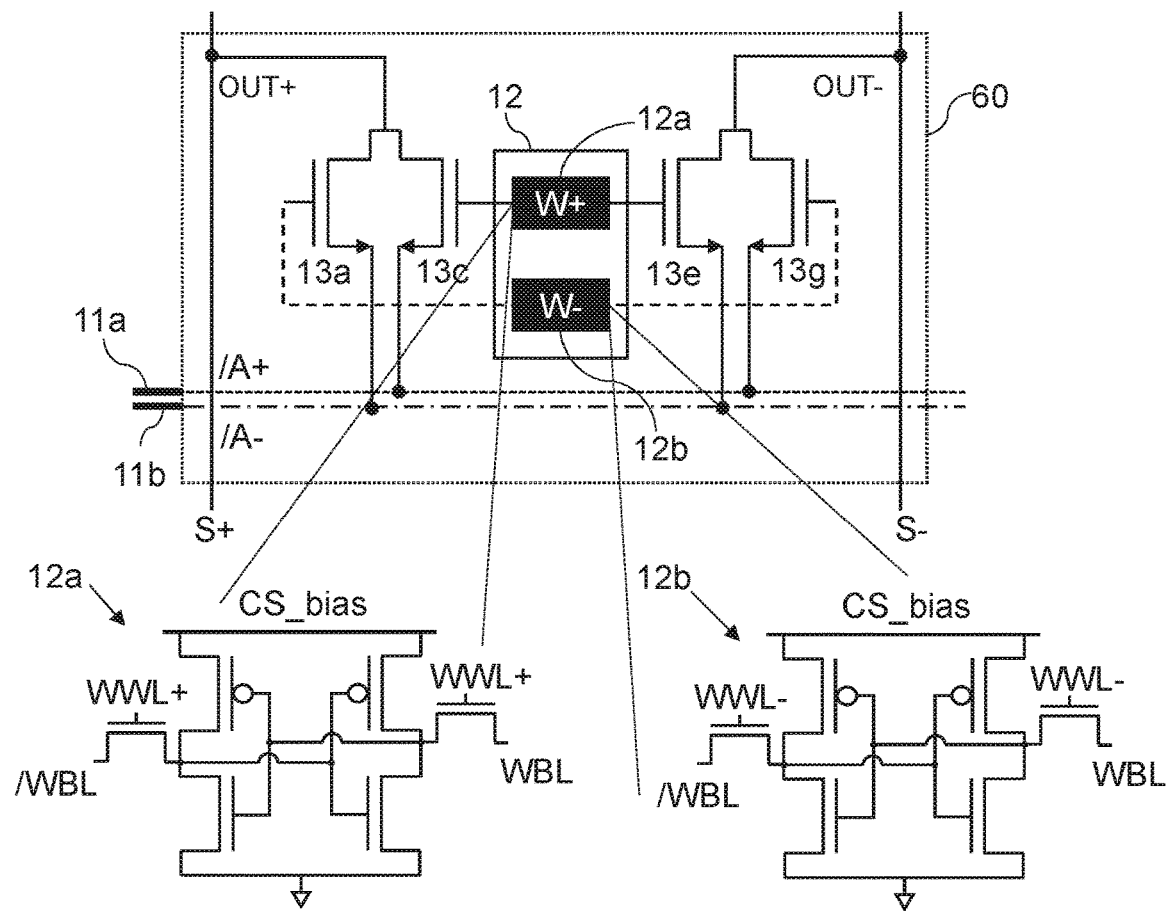
FIG. 6 is a compact variant of the compute cell in FIG. 5, wherein the transistor-based switches also function as current sources.

FIG. 5 and FIG. 6 illustrate embodiments of the disclosed technology in which only one transistor is associated with a corresponding conductive path. A first transistor 13a and a second transistor 13c have their drain terminals connected together and coupled to a first output OUT+ of the logic unit 13. Likewise, a third transistor 13e and a fourth transistor 13g have their drain terminals connected together and coupled to a second output OUT− of the logic unit. The source terminals of the first and third transistor 13a, 13e are operatively coupled to the second input connector 11b to receive an input signal/A− of the set of input signals/A+, /A−, whereas the source terminals of the second and fourth transistor 13c, 13g are operatively coupled to the second input connector 11b to receive an input signal/A+ of the set of input signals. Furthermore, the binary weight signal W+ of the storage cell 12a is supplied to the gate electrodes of the second a third transistor 13c, 13e, and the binary weight signal W− of the storage cell 12b is supplied to the gate electrodes of the first a fourth transistor 13a, 13g.

Akin to pass-transistor logic, the embodiments relating to FIG. 5 and FIG. 6 apply primary inputs W+, W− and/A+, /A− of the logic unit 13 both to the gate electrode and to the source terminal of the respective transistor associated with each conductive path. This has the advantage that a number of transistor per controlled conductive path can be reduced. Contrary to pass-transistor logic, the embodiments relating to FIG. 5 and FIG. 6 only provide a conductive path for actively pulling down the logic unit outputs OUT+, OUT− (that is, passing a strong zero), whereas no low-resistance path is provided between the logic unit outputs OUT+, OUT− and a positive power supply voltage (logic High) to also actively pull up the logic unit outputs OUT+, OUT−. Instead, the logic unit outputs OUT+, OUT− are left in a floating state, because the transistor-based current sources 55a, 55b automatically turn off when a logic High is received at the input connectors 11a, 11b. Likewise, the logic unit outputs OUT+, OUT− are left in a floating state already after pre-charging of the read bit lines if the corresponding transistor-based switches 13a, 13c, 13e, 13g are open, leading to a charging of the internal nodes 56a, 56b to about $V_{bias,CS}-V_{T,CS}$ and turned-off current source 55a, 55b.

This dynamic evaluation of the pre-charged logic unit outputs OUT+, OUT− has already been explained with respect to the embodiments of FIG. 2 to FIG. 4. As an example of the way the logic unit 13 selectively enables one of the plurality of conductive paths in the compute cells of FIG. 5 and FIG. 6, consider the first conductive path, which is enabled if the second binary-valued weight signal W− ascertains a logic High level and the second input signal/A−, supplied to the second input connector 11b, simultaneously takes on a logic Low level. It is noted that a logic Low level for the input signal/A− correspond to a logic High level for its complement A−, and vice versa. Likewise, the second conductive path is enabled only if the first binary-valued weight signal W+ ascertains a logic High level and the first input signal/A−, supplied to the first input connector 11a, takes on a logic Low level at the same time. Consequently, the first logic unit output OUT+ is actively driven Low only if the condition (W− AND A−) OR (W+ AND A+) is fulfilled (that is, evaluated TRUE).

As before, to the condition of actively pulling down the logic unit output OUT+, which results in the removal of a first partial charge Q1=I*T from the first read bit line S+ during the compound duty cycle T of the set of input signals, a logic High can be assigned to the complement/OUT+ of the logic unit output state OUT+, while to a floating logic unit output OUT+, during which no charge is removed/supplied to the first read bit line S+, a logic Low can be assigned to the complement/OUT+. Therefore, the same characterizing relations (/OUT+)=(W+ AND A+) OR (W− AND A−) and (/OUT−)=(W+ AND A−) OR (W− AND A+) as for the embodiments of FIG. 2 to FIG. 4 are recovered, demonstrating that the logic unit 13 selectively enables conductive paths according to the outcome of multiplying the signs of supplied data input and weight stored as balanced trit in the memory unit. The set of input signals/A+ and/A− may be derived from the set of input signals A+ and A−, for instance by using a digital-to-analog converter with an inverting converter output, or by placing an (additional) inverter on the corresponding data bit line.

In the embodiment of FIG. 5, the compute cell 50 further comprises two transistors 55a, 55b, each being connected between a respective logic unit output and a transistor-based switch of a selectively enabled path. Besides, the transistors 55a, 55b are adapted to operate in constant-current mode under appropriate biasing conditions of their gate electrodes, for example by applying a bias voltage signal $CS_{bias}$ such that the transistors 55a, 55b are operating in the saturation regime if the logic unit output OUT+ or OUT− is sufficiently High relative to a source terminal of the transistors 55a, 55b that is pulled Low. No current is provided by the transistor 55a or 55b if the corresponding logic unit output OUT+ or OUT− is not actively pulled down, because an intrinsic node 56a, 56b is charged up to the cutoff level of the respective transistor 55a, 55b. Assuming that an input signal/A+ and/A− is at VDD and the transistor-based switch receiving this input signal is closed, the internal node 56a or 56b charges up to about VDD−$V_{T,sel}$. As long as the read bit line (summation line) is also at a high voltage, the current-source transistor 55a or 55b is turned off, for example operates in sub-threshold regime with $V_{GS,CS}$∼$V_{bias,CS}$−(VDD−$V_{T,sel}$) <$V_{T,CS}$. If the read bit line wad pulled down by other compute cells to a voltage below VDD−$V_{T,sel}$, one would still have $V_{GS,CS}$<$V_{T,CS}$, despite the fact that the physical source and drain terminal would swap. Only if the read bit line is pulled down below $V_{bias,CS}$−$V_{T,CS}$, the current-source transistor 55a or 55b would start conducting current from the input connector into the read bit line, resulting in a single-ended clipping of the total accumulation result.

The constant-current source mimicking transistors 55a, 55b are preferably provided as long-channel transistors with gate length L larger than the gate width W, that is L>W, and L≳100 nm, for example L≈1 µm. Using long-channel transistors in their saturation regime as current sources has the advantage that the amount of current that is sunken or sourced by a plurality of such long-channel transistors is controlled more reliably, because variability of the threshold voltages across the plurality of long-channel transistors affect the amounts of current only minimally and short channel effects are absent. Alternatively, the constant-current source mimicking transistors 55a, 55b may be provided as short-channel transistors, for example L<100 nm, or cascaded output side of a current-mirroring circuit.

In embodiments of the disclosed technology that use a bias-controlled current source, a voltage swing, and hence a degree of accuracy at the readout of the read bit lines, can be controlled either by adjusting a unit pulse width of pulse-modulated input signals (for example smallest possible duty cycle T) or by adjusting the pull-down/pull-up strength of the compute cell set by the constant-current magnitude I of the current source, which is adjustable through the control bias. This has the advantage that an in-memory computing device comprising a plurality of compute cells can be operated at a faster rate by increasing the constant-current magnitude I of the current sources through the applied bias, for example for the purpose of increasing the execution speed of MVM with small number of data inputs per data input vector without scarifying accuracy. A further advantage is that an in-memory computing device including a plurality of compute cells can be operated at a slower rate by decreasing the constant-current magnitude I of the current sources through the applied bias, for example for the purpose of using longer pulse widths for the modulated set of input signals so that the accuracy/resolution of represented data inputs in the analog domain can be increased. Besides, the voltage swing on the read bit lines can be reduced, and energy saved, in applications in which a reduced output accuracy for the read bit line voltages is affordable.

The compute cell 60 of the embodiment relating to FIG. 6 differs from the compute cell 50 of the embodiment relating to FIG. 5 in that the two constant-current source mimicking transistors 55a, 55b are absent. Nonetheless, a constant-current mode operation is still accomplished in each conductive path by the combined action of the controlled switches, for example the transistors 13a 13c, 13e and 13g, and the memory unit 12. In particular, the positive power supply voltage supplying the storage cells 12a, 12b of the memory unit 12, for example two SRAM cells, is provided as an independently controlled bias voltage $CS_{bias}$, for example independent of the pre-charge voltage levels of the read bit lines and independent of the input signal voltage levels. This has the effect that the output voltage level that is used to represent a logic "1"-bit in the storage cells 12a, 12b is set by the bias voltage $CS_{bias}$, for example 0.6 V instead of VDD. Since it is this output voltage level of the storage cells 12a, 12b that is applied to the gate electrodes of the transistors 13a, 13c, 13e and 13g to turn them on, a gate voltage of these transistors in the "on"-state is also controllable via the bias voltage $CS_{bias}$. Therefore, the pull-down strength as set by the constant-current magnitude I of the transistors 13a, 13c, 13e, and 13g, which also act as constant-current sources in the present embodiment, is controlled via the positive power supply voltage, the bias voltage $CS_{bias}$, of the memory unit 12. A similar effect can be achieved for controlled switches in the conductive paths that are based on pMOS-FETs, for example using 0.2 V instead of VSS as lower output voltage level of the storage cells 12a, 12b that is applied to the gate electrodes of the pMOS-FETs as an independently controlled bias voltage.

Figure 7:
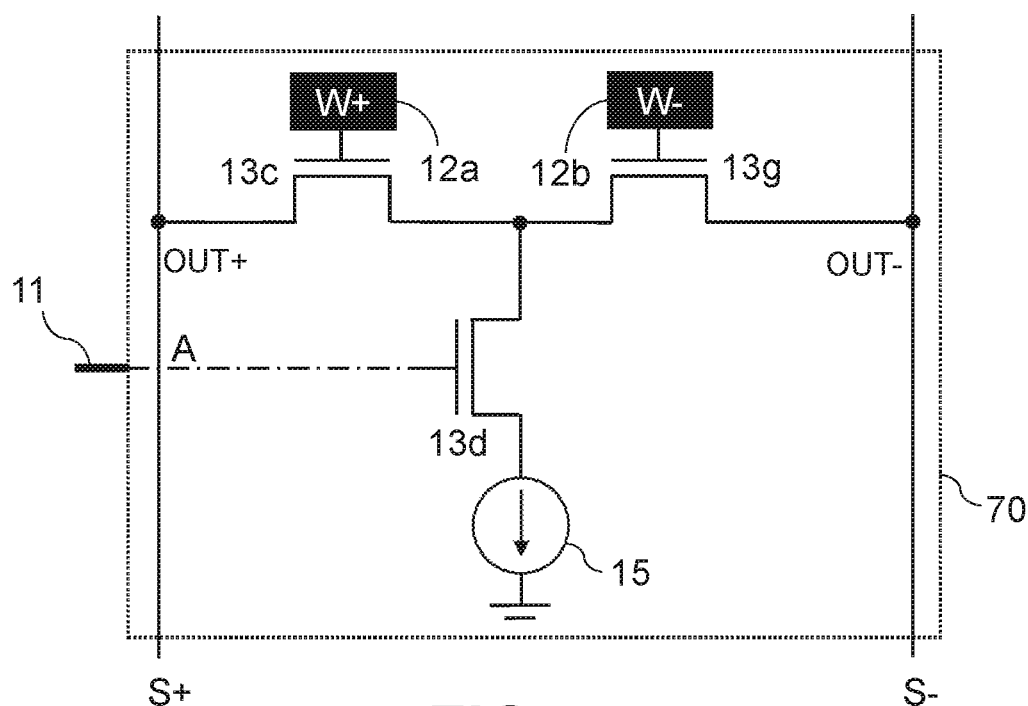
FIG. 7 and FIG. 8 are simplified variants of the compute cells shown in FIG. 4 and FIG. 5 respectively, for use with non-negative or rectified inputs only.
Figure 8:
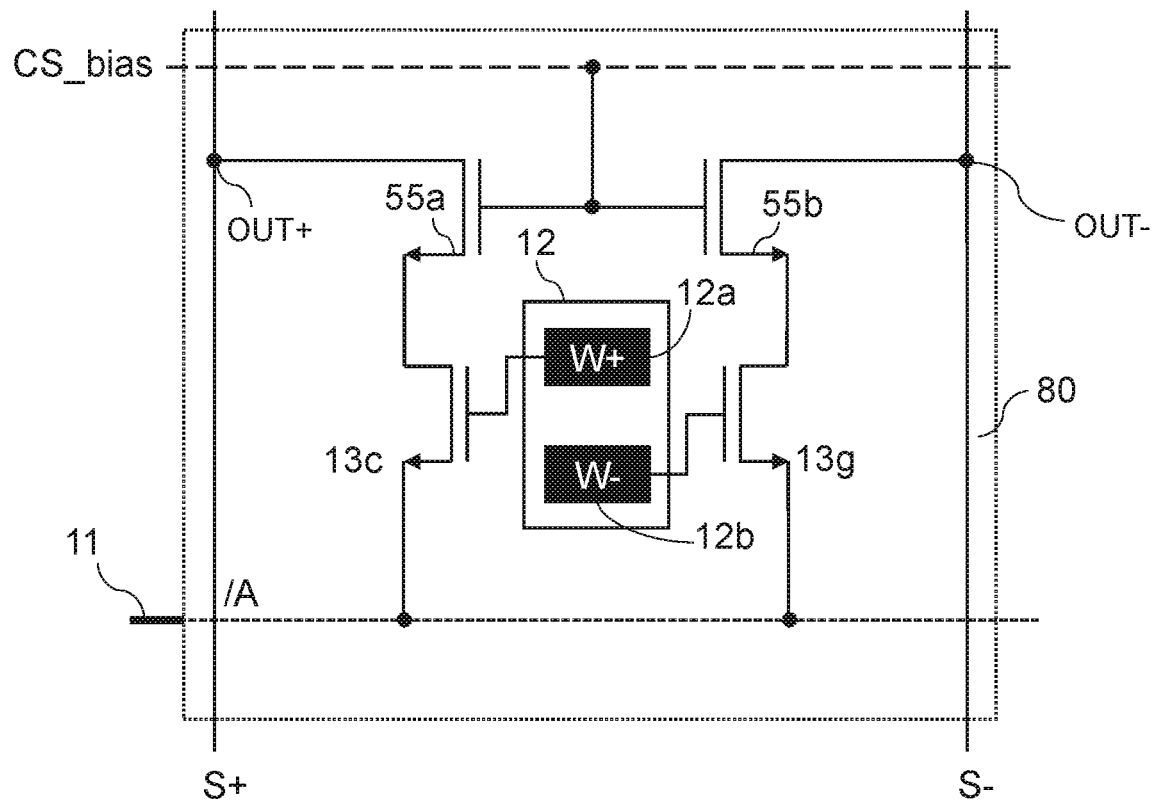

FIG. 7 and FIG. 8 depict alternative compute cells according to embodiments of the disclosed technology, which are simplifications of the compute cells shown in FIG. 4 and FIG. 5, respectively. The simplifications consist in reducing the number of conductive paths controlled by the logic unit 13 from four to two, by supplying only one single-ended input signal A, respectively/A, to the input connector 11 of the compute cell. A single input signal is sufficient for embodiments of the disclosed technology in which only non-negative data inputs (that is, unsigned data inputs with sgn(X)≥0) are conveyed to the compute cell; in DNNs with rectifying linear units (ReLU) as neuron transfer functions, for instance, the layer outputs are always non-negative and thus can serve as non-negative data inputs to the next layer. A conveyed sign of a non-negative data input is restricted to only two values, zero and one. Moreover, the zero-valued sign corresponds to an input signal that is a constant zero, for example a duty cycle T is set to zero, and does not require any additional encoding. Therefore one data line and corresponding input connector are sufficient to receive the supplied unsigned data inputs.

Indeed, assuming the absence of negative data inputs in the embodiment of FIG. 4, the input signal A− received at the second input connector 11b would always be Low and the corresponding transistor-based switch 13b always open. In consequence, the conductive paths associated with the transistor 13b, for example the two conductive paths extending through the transistors 13a and 13e respectively, would never be enabled. This means that the three transistors 13b, 13a and 13e are not serving any purpose if the supplied data inputs were unsigned, for example non-negative data inputs, which is the reason why they are missing in the simplified compute cell 70 in FIG. 7. The same reasoning applies to the compute cell 50 in FIG. 5, for which unsigned data inputs would result in a second input signal /A− at the second input connector 11b, which is always High. In consequence, the logic unit outputs OUT+ and OUT− would never be actively pulled down through the corresponding closed transistor-based switches 13a and 13e, respectively. This means that the two transistors 13a and 13e are losing their purpose if the supplied data inputs were unsigned, for example non-negative data inputs, which is the reason why they are missing in the simplified compute cell 80 in FIG. 8.

Figure 12:
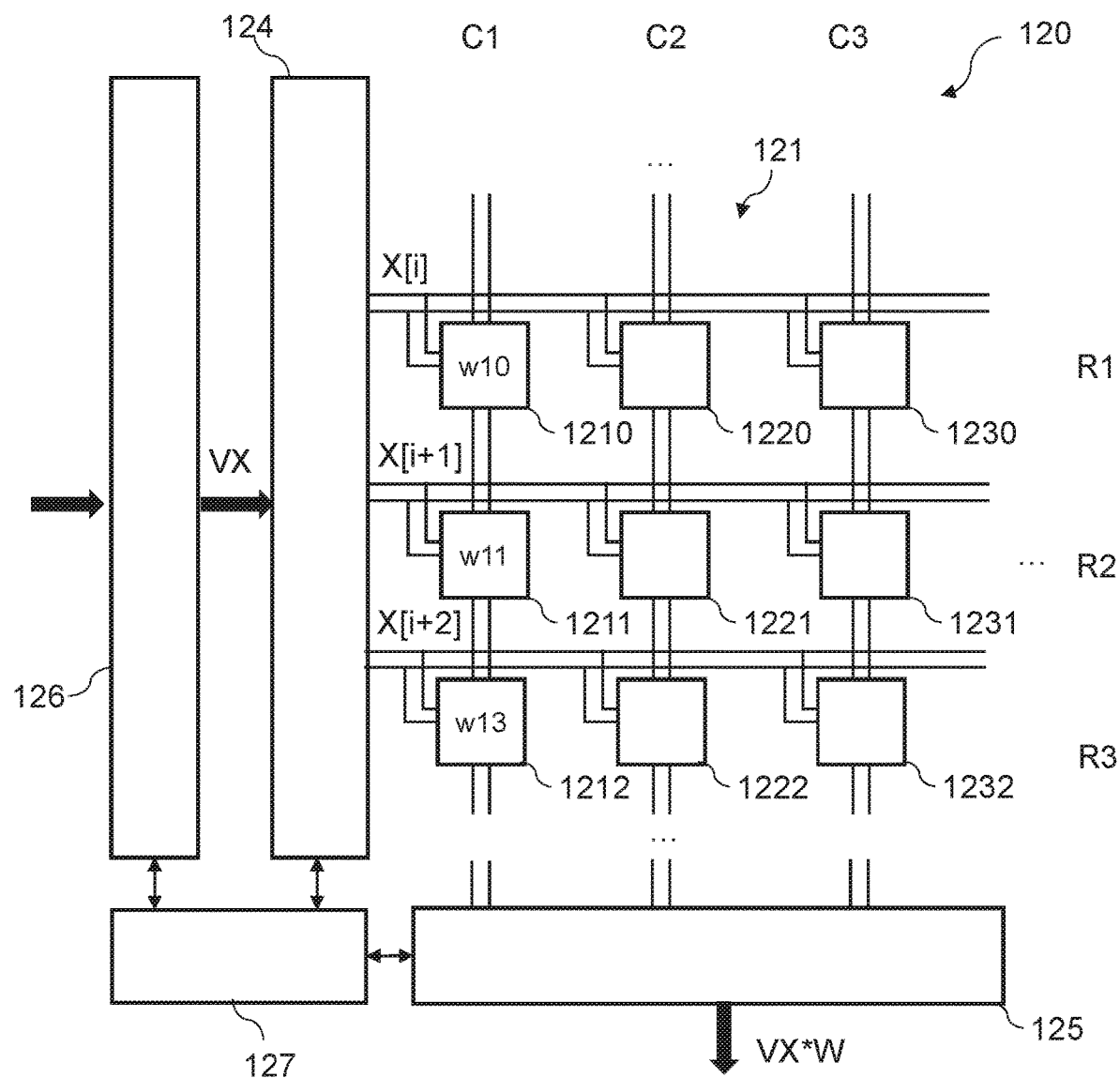
FIG. 12 shows an in-memory computing device including an array of compute cells, according to an embodiment of the disclosed technology.

In a further aspect, the disclosed technology relates to an in-computing device for machine learning applications, which includes an array of compute cells according to embodiments of the previous aspect. Referring to FIG. 12, a mixed-signal implementation of an in-computing device 120 is shown which is adapted to perform matrix-vector multiplications of a vector of input data VX and a matrix of weights W, stored in the array of compute cells 121, for example an array of size 1024*512 (rows*columns). A stream of input data vectors may be received by an input buffer 126 before being sent to a data line driver 124 which includes a plurality of digital-to-analog converters (DACs), for example up to 1024 DACs corresponding to 1024 rows of compute cells, or more. The DACs of the data line driver 124 convert the digital data input, for example a signed 6 bit-word, contained in each component of the data vector VX into a corresponding set of modulated input signals. The DACs may be configured to generate pulse-width modulated sets of input signals, wherein each set of input signals represents the magnitude and sign of a different data input of the vector VX. Each set of input signals is then applied to a corresponding group of data lines to supply this set of input signals to the set of input connectors of the compute cells arranged in a same row of the array 121. For instance, a set of input signals representative of digital data input Xi is supplied to the compute cells 1210, 1220, 1230, etc. of the array of compute cells, another set of input signals representative of digital data input Xi+1 is supplied to the compute cells 1211, 1221, 1231, etc. of the array of compute cells, and so on. Repeaters may be placed on the data lines to ensure proper timing and to avoid pulse shrinking with regard to the set of pulse-width modulated input signals.

As described before, each compute cell is configured for determining the product of the supplied digital data input and the balanced ternary weight stored in that cell, and apply this partial result to one or more read bit lines that are connected to the compute cell. The result is only partial in the sense that it takes many compute cells in a column of the array to accumulate the product determined by each individual compute cell with respect to the ternary weight it holds. For instance, compute cell 1210 determines the product Xi*w10, compute cell 1211 the product Xi+1*w11, compute cell 1212 determines the product Xi+2*w12, etc., wherein the individual weights w10, w11, w12, etc., are representing balanced ternary weights of a weight matrix, for example a weight matrix associated with a trained machine-learning model, for example the weights associated with filters in a layer of a CNN. As a result, each column of the array 121 accumulates the partial products of its compute cells on the respective set of read bit lines, which may consist of a single read bit line in some embodiments of the disclosed technology. For example, the voltage levels of the set of read bit lines relating to the column C1 of the array 121 are representative of the sum $\Sigma_{c \in C1}$ w[c]X[c]. The sum signals on the read bit lines associated with the column of the array 121 are read out and converted back into the digital domain by readout circuitry 125 of the device 120, for example a plurality of analog-to-digital converters (ADCs), for example 6 bit SAR-ADCs. The output signals generated by the readout circuitry 125 thus represent the vector components of the matrix-vector product VX*W. An output precision of the matrix-vector product VX*W may be controlled by the precision of the readout circuitry, for example the effective number of bits associated with the ADCs of the readout circuitry 125 may be programmable. The in-memory computing device, for example measuring 1.94 mm$^2$ and including 1024*512 compute cells, may produce outputs of the matrix-vector product VX*W at a rate of several MHz, for example more than 5 MHz, for example more than 20 MHz. It is an advantage of embodiments of the disclosed technology that a good linearity and offset is obtained for the ADCs of the readout circuitry 125. A good linearity is also obtained for the DACs of the data line driver 124.

It is a further advantage of embodiments of the disclosed technology that each compute cell of the array can hold a three-valued weight w of the weight matrix W. Therefore, less compute cells are required to the entries of the weight matrix which use more than single-bit accuracy. In embodiments of the disclosed technology, the pull-down/pull-up strength of adjacent, or non-adjacent, compute cells of a same column and/or row may be scaled such that the supplied partial charges thereof are weighted by natural powers of two or three. This weighting of a group of compute cells allows more accurate weights w of the weight matrix to be stored in the compute cells of the array 121. This scaling of pull-down/pull-up strength of the group of compute cells may be achieved, for example, by adjusting the bias voltages $CS_{bias}$ to the current-sources in the compute cells of the respective groups. A controller 127 of the device 120 may be used to control the pull-down/pull-up strength, and thus the magnitude of the supplied first and second partial charges, of individual groups of compute cells, for example by adjusting the corresponding bias voltages $CS_{bias}$ supplied to the current sources of the compute cells in these groups. In contrast to a mapping of weights onto a single compute cell, which allows the levels −1, 0, and 1 to be represented, a power of two scaling which maps each weight w of the matrix W to more than just a single compute cell allows more quantization levels to be represented correctly.

For instance, scaling the constant-current magnitudes of each group of three compute cells, for example cells 1210, 1211 and 1212, via the corresponding bias voltages such that $I_{1212}=2*I_{1211}=4*I_{1210}$ allows the following 3 bit-wide quantization of each weight w of the matrix W to be correctly represented by the three-cell groups: −7, −6, . . . , 0, . . . , 6, 7. Using a balanced ternary representation for the weights w of the matrix W and a scaling factor of three instead of two, a much larger range of quantization levels can be obtained with the same number of compute cells per group, for example the entire range −13, −12, . . . , 0, 12, 13 is covered by groups of three compute cells. The scaling the constant-current magnitudes of each group of three compute cells can be extended to complete rows of the array 121, for example row R1, R2, R3. It may also be used to attribute a different importance to a particular type of data input in the vector VX, for example it may be used to weight recurrent data inputs differently than non-recurrent data inputs in network layers of recurrent ANNs, for example LSTM.

As an alternative to the preceding example, which requires identical inputs to the group of three cells, for example cells 1210, 1211 and 1212, the scaling of the partial charge magnitudes may be applied column-wise, for example to all the compute cells on a same column C1, C2, . . . of the array 121. This avoids that the data inputs have to be duplicated. For example, compute cells of the column C1, C2 and C3 may have their corresponding bias voltages set by a controller 127 such that $I_{C3}=2*I_{C2}=4*I_{C1}$, allowing a 3 bit-wide quantization of each weight w of the matrix W to be achieved. It is possible to directly provide for a way to shorten the read bit lines of the three columns C1, C2, C3 together. Moreover, a larger scaling factor may be split over more than one column of the array. For instance, the ternary weights stored in the compute cells of the third column may be copied into the compute cells of the fourth column and the controller 127 sets the bias voltages of the compute cells in the third and fourth column to be $I_{C3}+I_{C4}=(2+2)*I_{C1}$. It is noted that cell group scaling with natural powers of four or higher may be implemented as well, at the cost that not all weight levels can be represented correctly.

Another option to increase the number of quantization levels available for each weight w of the matrix W, which would require a non-uniform implementation of compute cells across the array, may involve a geometric scaling of the transistors in the conductive paths such that scaled pulled-up/pull-down currents can be sourced or sunken by the different types of compute cells. Yet another alternative may consist of the scaling of the logic amplitudes used to represent a High state of the set of input signals across multiple rows of the array. Eventually, the scaling may be obtained in the readout circuitry 125 outside the array, for example by using charge sharing between a series of size-scaled capacitances which can be operatively connected and disconnected to the read bit lines of a corresponding series of compute cell columns.

While the disclosed technology has been illustrated and described in detail in the drawings and foregoing description, such illustration and description are to be considered illustrative or exemplary and not restrictive. The foregoing description details certain embodiments of the disclosed technology. It will be appreciated, however, that no matter how detailed the foregoing appears in text, the disclosed technology may be practiced in many ways. The disclosed technology is not limited to the disclosed embodiments.

For example, it is possible to operate the disclosed technology in an embodiment wherein the compute cell is connectable to only one read bit line and is configured to selectively charge or discharge this one read bit line. This is illustrated in the embodiments relating to FIG. 9 and FIG. 10. In contrast to the compute cells of the preceding embodiments, the sign of the product of data input and stored balanced ternary weight is not obtained through a differential measurement involving a differential pair of read bit lines S+, S−, but on a single read bit line S.

Figure 9:
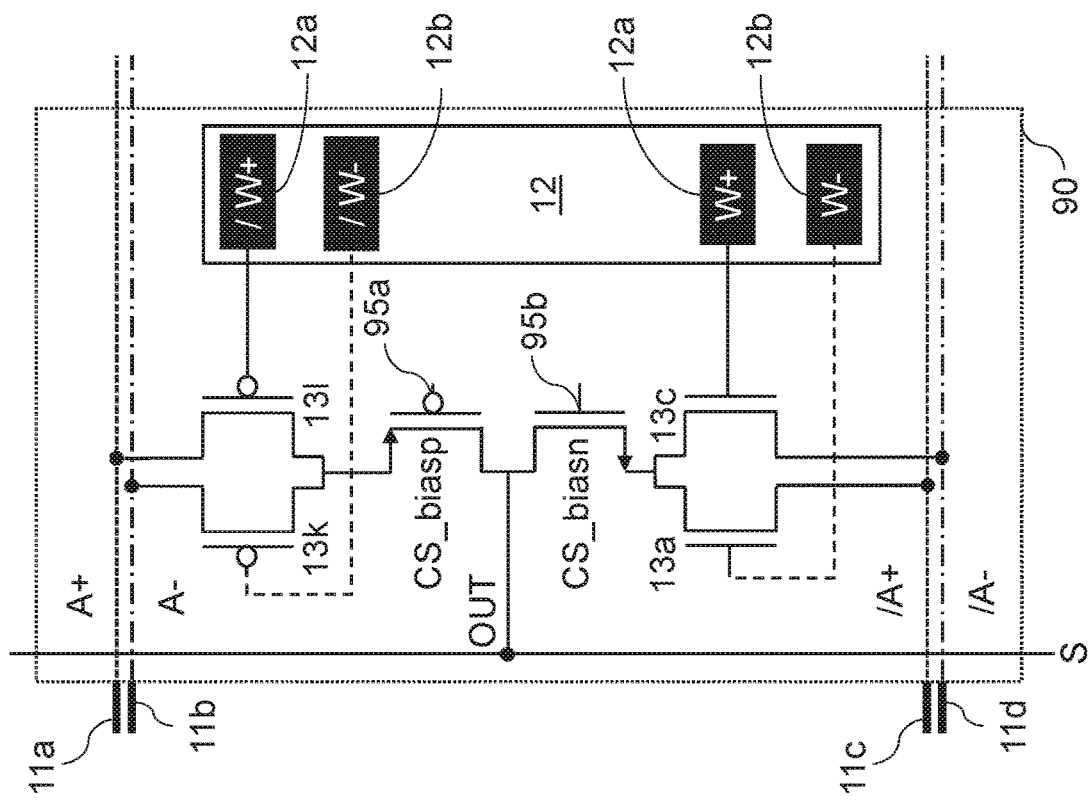
FIG. 9 shows a compute cell for in-memory computing according to an embodiment of the disclosed technology, including only a single output node connectable to a single read bit line, for the selectively charging or discharging thereof.

In the compute cell 90 of FIG. 9 this is achieved by selectively enabling one of two conductive paths for pulling up the single logic unit output OUT, whereby a first, positive partial charge Q1=I*T is supplied to the read bit line S during the compound duty cycle T of the set of input signals A+, A−, and further by selectively enabling one of two conductive paths for pulling down the single logic unit output OUT, whereby a second, negative partial charge Q2=−I*T is supplied to the read bit line S during the compound duty cycle T of the set of complement input signals/A+, /A−. It is apparent that the second partial charge is of the same magnitude as the first partial charge, but has opposite sign, for example Q2=−Q1, and the ratio r=Q2/Q1=−1. Furthermore, the set of input signals A+, A− and their complements/A+, /A− are an example of a set of input signals that are being transmitted differentially as complementary pairs.

The particularities of the logic unit 13 for selectively enabling a plurality of conductive paths in FIG. 9 are the following. A first conductive path is enabled if the first input signal A+ is a logic High and the transistor 13$l$ acts as a closed switch by applying a binary-valued weight signal/W+ that is a logic Low. A second conductive path is enabled if the second input signal A− is a logic High and the transistor 13$k$ acts as a closed switch by applying a binary-valued weight signal/W− that is a logic Low. The first and second conductive path, when enabled, are pulling up the logic unit output OUT, for example to the logic High level of the received input signals A+, A−, for example to VDD. The transistors associated with these conductive paths are provided as p-type transistors, for example pMOS-FETs. Furthermore, a third conductive path is enabled if the complement of the first input signal, /A+, is a logic Low and the transistor 13$a$ acts as a closed switch by applying a binary-valued weight signal W− that is a logic High, and a fourth conductive path is enabled if the complement of the second input signal, /A−, is a logic Low and the transistor 13$c$ acts as a closed switch by applying a binary-valued weight signal W+ that is a logic High. The third and fourth conductive path, when enabled, are pulling down the logic unit output OUT, for example to the logic Low level of the received input signals/A+, /A−, for example to VSS or ground. The transistors associated with these conductive paths are provided as n-type transistors, for example nMOS-FETs. In the embodiment of FIG. 9, the read bit line S may be pre-charged to an intermediate voltage level, for example to VDD/2, to ensure that a voltage swing can be positive or negative as a function of the sign of the supplied partial charge. Besides, two optional transistors 95$a$ and 95$b$ of opposite polarity, for example one pMOS and one nMOS long-channel transistor, may be connected between the logic unit output OUT and the drain terminals of the transistors 13$k$, 13$l$, respectively the drain terminals of the transistors 13$a$, 13$c$. A separate bias voltage signal $CS_{biasp}$, $CS_{biasn}$ may be provided to the respective gate electrodes of the current-source mimicking transistors 95$a$, 95$b$ to match their constant-current magnitudes I.

Denoting a logic unit output OUT that is actively being pulled up and down as a logic "1" and a logic "0" respectively, one obtains the following conditions for determining an output state: OUT=1 if (A+ AND W+) OR (A− AND W−)=TRUE, and OUT=0 if (A+ AND W−) OR (A− AND W+)=TRUE. These conditions have already been encountered in the preceding embodiments for the two separate logic unit outputs OUT+ and OUT−. In the present embodiment, however, the supplied first and second partial charge have opposite sign so that summation is obtained on the single read bit line S. Once more it is verified that $\Delta Q = Q1 - Q2 = W_{bal3} * abs(X) = X * W_{bal3}$.

Figure 10:
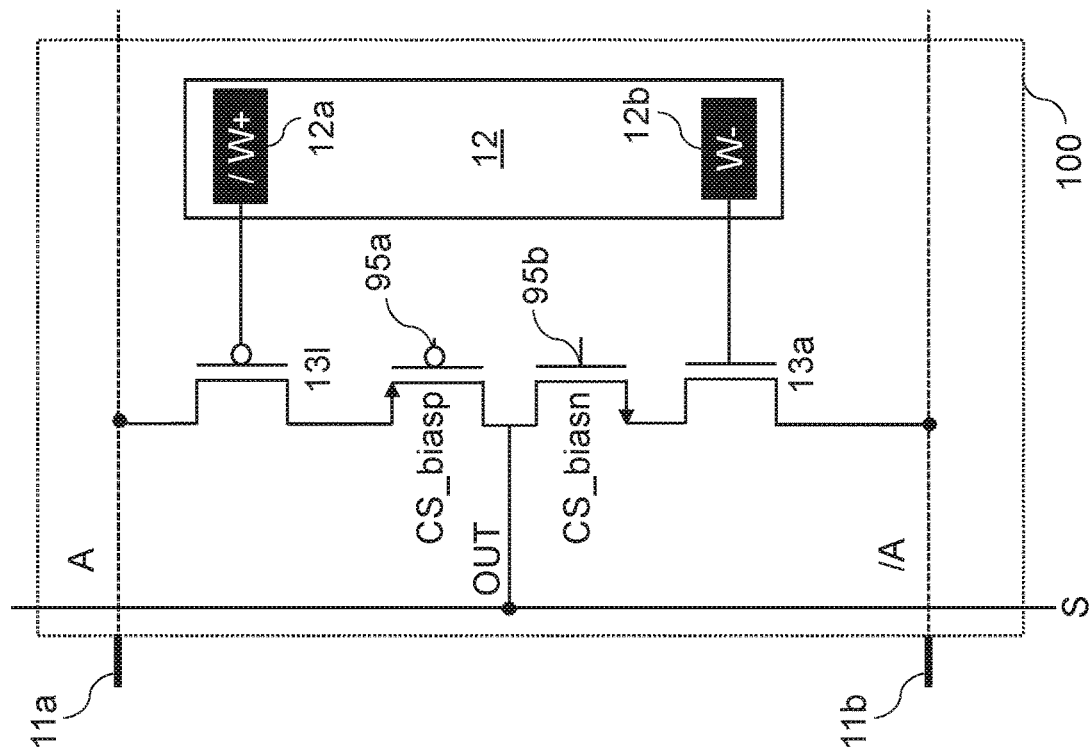
FIG. 10 is a simplified variant of the compute cell shown in FIG. 9, for use with non-negative or rectified inputs only.

The compute cell 100 in FIG. 10 is a simplification of the compute cell 90 shown in FIG. 9, which is made with regard to unsigned data inputs, for example non-negative data inputs, in the same way as previously described with respect to the embodiments of FIG. 7 and FIG. 8. Compared to the embodiments of FIG. 7 and FIG. 8, the compute cell 100 in FIG. 10 includes a set of two input connectors 11$a$, 11$b$ for receiving the modulated input signal A and its complement/A as a set of complementary input signals. The simplification allows the number of transistors in the compute cell to be reduced, for example a more compact and energy-efficient compute cell can be obtained.

Figure 11:
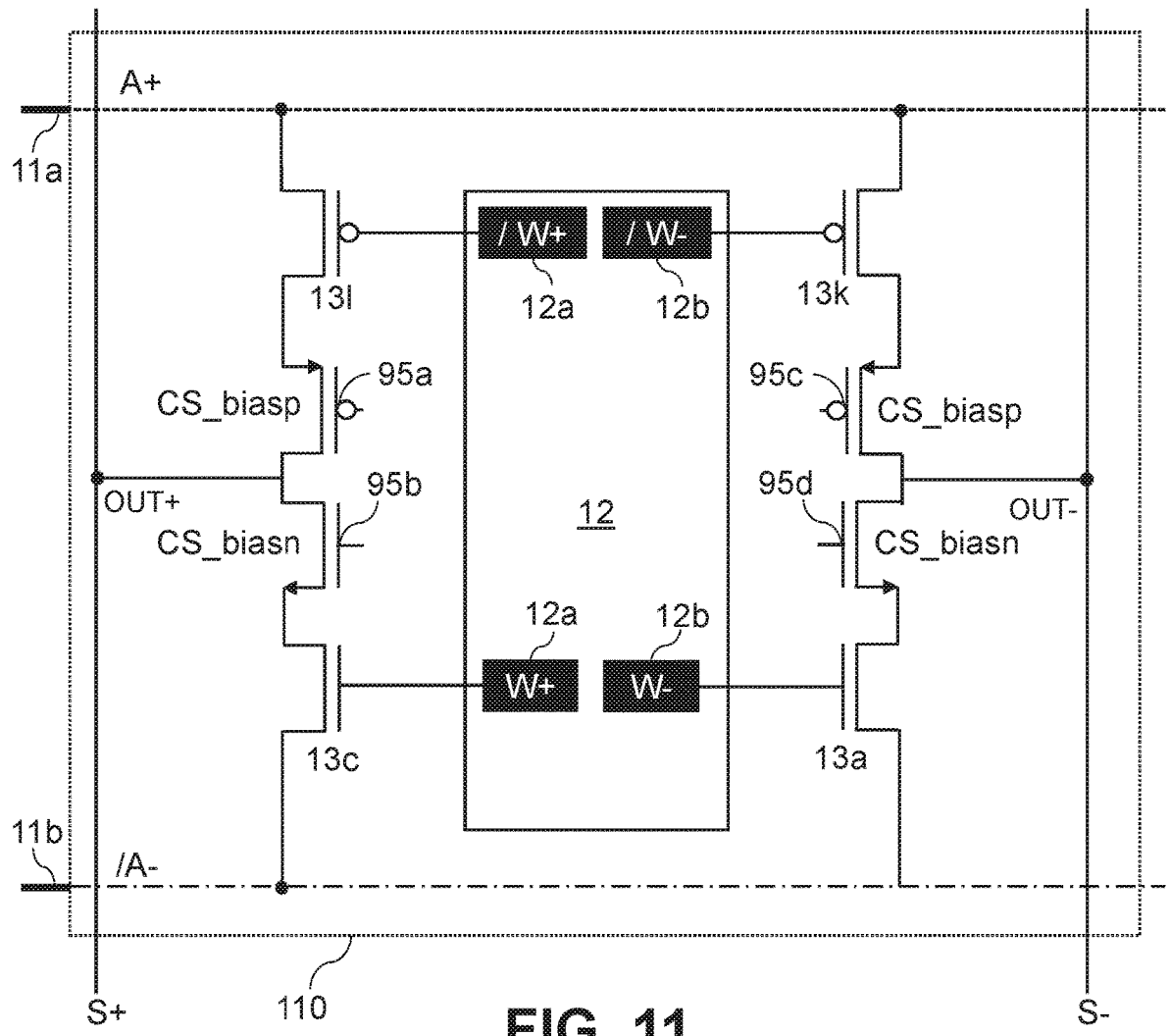
FIG. 11 shows a compute cell for in-memory computing according to an embodiment of the disclosed technology, including a pair of output nodes connectable to a corresponding pair of read bit lines, for the selectively charging or discharging of each read bit line of the pair.

FIG. 11 shows a compute cell 110 which is a variant of the compute cell 90 in FIG. 9. Compared to the compute cell 90, the compute cell 110 requires less input connectors, for example only a first input connector 11$a$ for receiving a single-ended, first input signal A+ and a second input connector 11$b$ for receiving a single-ended-second input signal/A−. This reduction of the number of input connectors and associated input signals is obtained at the cost of introducing a second read bit line. As in previous embodiments, the two read bit lines S+ and S− are arranged as a differential pair which represent the outcome of multiplying the supplied data input with the stored balanced ternary weight as a difference signal, for example the difference in voltages that are read out on the read bit lines S+ and S− of the pair. An important difference of the present embodiment, as compared to the previous embodiments using a differential pair of read bit lines, resides in the fact that the logic unit of the compute cell 110 is configured to both charge and discharge each one of the two read bit lines S+ and S− via the corresponding logic unit outputs OUT+ and OUT−.

It is apparent from FIG. 11 that the second and fourth conductive path controlled by the logic unit therein are the same as in the embodiment of FIG. 9, for example the logic unit output OUT+ connectable to the first read bit line S+ is pulled up or down by selectively enabling the first or third conductive path. To reduce the number of input connectors one exploits the fact that the complementary logic function is obtained under a combined reversal of the conductivity-type of the transistors that are involved in this function, for example p-type to n-type and vice-versa, the logic power supply level applicable to the source terminals of these transistors, for example VDD to VSS/ground and vice versa, and the logic level of the control signal supplied to the gate electrode of these transistors. With respect to the compute cell 90 in FIG. 9 this means that the p-type transistor 13$k$ associated with the first conductive path can be replaced by an n-type transistor 13$a$, provided that the input signal A− supplied to the source terminal thereof is substituted by its complement, /A−, and also the binary-valued weight signal/ W− is inverted to W−. Likewise, the n-type transistor 13$a$ associated with the third conductive path can be replaced by a p-type transistor 13$k$, provided that the input signal/A+ supplied to the source terminal thereof is substituted by its complement, A+, and also the binary-valued weight signal W− is inverted to/W−. This is indeed what has been implemented in the compute cell 110 of FIG. 11 with respect to the first and third conductive path. However, as these reversals also flip the sign of the logic state at the output, a second logic unit output OUT− and corresponding read bit line S− is needed in the embodiment of FIG. 11. Besides, two more transistors 95$c$, 95$d$ of opposite polarity, for example one pMOS and one nMOS long-channel transistor, have been connected between the logic unit output OUT− and the drain terminals of the transistors 13$k$, 13$a$. A separate bias voltage signal $CS_{biasp}$, $CS_{biasn}$ may be provided to the respective gate electrodes of the current-source mimicking transistors 95$c$, 95$d$ to match their constant-current magnitudes I, and further match them to those of the current-source mimicking transistors 95$a$, 95$b$.

In all of the preceding embodiments, the compute cells and in-memory computing device can be provided as an integrated circuit. Foundry technology may be used for their manufacture, for example for SRAM-based compute cells.

Other variations to the disclosed embodiments can be understood and effected by those skilled in the art in practicing the disclosed technology, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. A compute cell for in-memory multiplication of a digital data input and a balanced ternary weight, comprising:
    a set of input connectors for receiving a corresponding set of modulated input signals (A+, A−) representative of a sign and a magnitude of the digital data input;
    a memory unit configured for storing the balanced ternary weight;
    a logic unit connected to the set of input connectors and the memory unit to receive the data input and the balanced ternary weight, the logic unit configured to: selectively enable one of a plurality of conductive paths for supplying a first charge to a read bit line (S; S+, S−) during a duty cycle of the set of input signals if the data input and the balanced ternary weight both have a positive sign or both have a negative sign, selectively enable a different one of the plurality of conductive paths for supplying a second charge to the same one read bit line (S), or to a different one read bit line (S+, S−), during the duty cycle if the data input and the balanced ternary weight have opposite signs, and disable each of the plurality of conductive paths if at least one of the group consisting of the balanced ternary weight and the data input has zero magnitude, in order to prevent any supply of charges to the one or more read bit lines, wherein the duty cycle is indicative of the data input magnitude, and wherein a ratio of the first to the second charge is negative one if the first and second charge are supplied to a same read bit line, and positive one if the first and second charge are supplied to different read bit lines; and
    at least one current source, each current source being disposed in a conductive path of the plurality of conductive paths and configured to supply one of the first and second charge by inducing a constant current on that conductive path during the duty cycle.

2. The compute cell according to claim 1, wherein the memory unit comprises a first storage cell and a second storage cell for storing two binary-valued weight signals (W+, W−) encoding the balanced ternary weight, and wherein at least one of the first storage cell and second storage cell comprises one of the group consisting of: SRAM cell, DRAM cell, Ferro-FET, flash transistor, resistive RAM, phase-change memory.

3. The compute cell according to claim 1, wherein the set of input connectors comprises a first and a second single-ended input connector for receiving a modulated first and second input signal (/A+, /A−), and wherein the logic unit further comprises:
    a first and a second output (OUT+, OUT−) connectable to respective ones of a differential pair of read bit lines (S+, S−);
    a first transistor connected between the first output (OUT+) and the first input connector and having a gate electrode connected to the memory unit to receive a first one (W+) of a set of binary-valued weight signals encoding the balanced ternary weight, for selectively enabling a first conductive path if the data input and the balanced ternary weight both have positive sign;
    a second transistor connected between the first output and the second input connector and having a gate electrode connected to the memory unit to receive a second one (W−) of the set of binary-valued weight signals encoding the balanced ternary weight, for selectively enabling a second conductive path if the data input and the balanced ternary weight both have negative sign;
    a third transistor connected between the second output (OUT−) and the first input connector and having a gate electrode connected to the memory unit to receive the second binary-valued weight signal (W−), for selectively enabling a third conductive path if the data input has positive sign and the balanced ternary weight has negative sign; and
    a fourth transistor connected between the second output (OUT−) and the second input connector and having a gate electrode connected to the memory unit to receive the first binary-valued weight signal (W+), for selectively enabling a fourth conductive path if the data input has negative sign and the balanced ternary weight has positive sign.

4. The compute cell according to claim 3, wherein transistors with gate electrodes connected to the memory unit are provided as long-channel transistors.

5. The compute cell according to claim 1, wherein the set of input connectors comprises a first and a second single-ended input connector for receiving a modulated first and second input signal (A+, /A−), and wherein the logic unit further comprises:
- a first and a second output (OUT+, OUT−) connectable to respective ones of a differential pair of read bit lines (S+, S−);
- a first transistor of a first conductivity type connected between the first output (OUT+) and the first input connector and having a gate electrode connected to the memory unit to receive a first one (/W+) of a set of binary-valued weight signals encoding the balanced ternary weight, for selectively enabling a first conductive path if the data input and the balanced ternary weight both have positive sign;
- a second transistor of a second conductivity type, opposite to the first conductivity type, connected between the first output (OUT+) and the second input connector and having a gate electrode connected to the memory unit to receive the complement (W+) of the first binary-valued weight signal, for selectively enabling a second conductive path if the data input has negative sign and the balanced ternary weight has positive sign;
- a third transistor of the first conductivity type connected between the second output (OUT−) and the first input connector and having a gate electrode connected to the memory unit to receive a second one (/W−) of the set of binary-valued weight signals encoding the balanced ternary weight, for selectively enabling a third conductive path if the data input has positive sign and the balanced ternary weight has negative sign; and
- a fourth transistor of the first conductivity type connected between the second output (OUT−) and the second input connector and having a gate electrode connected to the memory unit to receive the complement (W−) of the first binary-valued weight signal, for selectively enabling a fourth conductive path if the data input and the balanced ternary weight both have positive sign.

6. The compute cell according to claim 1, wherein the set of input connectors comprises a first and a second single-ended input connector for receiving a modulated first and second input signal (A+, A−), and wherein the logic unit further comprises:
- a first and a second output (OUT+, OUT−) connectable to respective ones of a differential pair of read bit lines (S+, S−);
- a first pair of drain-source connected transistors connected between the first output (OUT+) and a logic power supply, for selectively enabling a first conductive path if the data input and the balanced ternary weight both have positive sign, wherein a first transistor of the first transistor pair has a gate electrode connected to the memory unit to receive a first one (W+) of a set of binary-valued weight signals encoding the balanced ternary weight, and a second transistor of the first transistor pair has a gate electrode connected to the first input connector;
- a second pair of drain-source connected transistors connected between the first output (OUT+) and a logic power supply, for selectively enabling a second conductive path if the data input and the balanced ternary weight both have negative sign, wherein a first transistor of the second transistor pair has a gate electrode connected to the memory unit to receive a second one (W−) of a set of binary-valued weight signals encoding the balanced ternary weight, and a second transistor of the second transistor pair has a gate electrode connected to the second input connector;
- a third pair of drain-source connected transistors connected between the second output (OUT−) and a logic power supply, for selectively enabling a third conductive path if the data input has positive sign and the balanced ternary weight has negative sign, wherein a first transistor of the third transistor pair has a gate electrode connected to the memory unit to receive the second binary-valued weight signal (W−), and a second transistor of the third transistor pair has a gate electrode connected to the first input connector; and
- a fourth pair of drain-source connected transistors connected between the second output (OUT−) and a logic power supply, for selectively enabling a fourth conductive path if the data input has negative sign and the balanced ternary weight has positive sign, wherein a first transistor of the fourth transistor pair has a gate electrode connected to the memory unit to receive the first binary-valued weight signal (W+), and a second transistor of the fourth transistor pair has a gate electrode connected to the second input connector.

7. The compute cell according to claim 1, wherein the set of input connectors comprises a first pair of complementary input connectors for receiving a first modulated input signal (A+) and its complement (/A+), and a second pair of complementary input connectors for receiving a modulated second input signal (A−) and its complement (/A−), and wherein the logic unit further comprises:
- an output (OUT) connectable to a read bit line (S);
- a first transistor of a first conductivity type having a drain electrode connected to the output (OUT), a source electrode connected to a first one of the first pair of complementary input connectors to receive the first input signal (A+), and a gate electrode connected to the memory unit to receive a first one (/W+) of a set of binary-valued weight signals encoding the balanced ternary weight, for selectively enabling a first conductive path if the data input and the balanced ternary weight both have positive sign;
- a second transistor of the first conductivity type having a drain electrode connected to the output (OUT), a source electrode connected to a first one of the second pair of complementary input connectors to receive the second input signal (A−), and a gate electrode connected to the memory unit to receive a second one of the set of binary-valued weight signals (/W−) encoding the balanced ternary weight, for selectively enabling a second conductive path if the data input and the balanced ternary weight both have negative sign;
- a third transistor of a second conductivity type, opposite to the first conductivity type, having a drain electrode connected to the output (OUT), a source electrode connected to a second one of the first pair of complementary input connectors to receive the complement of the first input signal (/A+), and a gate electrode connected to the memory unit to receive the complement of the second binary-valued weight signal (W−), for selectively enabling a third conductive path if the data input has positive sign and the balanced ternary weight has negative sign; and a fourth transistor of the second conductivity type having a drain electrode connected to the output (OUT), a source electrode connected to a second one of the second pair of complementary input connectors to receive the complement of the second input signal (/A−), and a gate electrode connected to the memory unit to receive the complement of the first binary-valued weight signal (W+), for selectively enabling a fourth conductive path if the data input has negative sign and the balanced ternary weight has positive sign.

8. The compute cell according to claim 1, wherein the set of input connectors comprises a pair of complementary input connectors for receiving a modulated input signal (A) and its complement (/A), and wherein the logic unit further comprises:

an output (OUT) connectable to a read bit line (S);

a first transistor of a first conductivity type having a drain electrode connected to the output (OUT), a source electrode connected to a first one of the pair of complementary input connectors to receive the input signal (A), and a gate electrode connected to the memory unit to receive a first one (/W+) of a set of binary-valued weight signals encoding the balanced ternary weight, for selectively enabling a first conductive path if the data input and the balanced ternary weight both have positive sign; and a second transistor of a second conductivity type, opposite to the first conductivity type, having a drain electrode connected to the output (OUT), a source electrode connected to a second one of the pair of complementary input connectors to receive the complement of the input signal (/A), and a gate electrode connected to the memory unit to receive a second one (W−) of the set of binary-valued weight signals, for selectively enabling a second conductive path if the data input has positive sign and the balanced ternary weight both has negative sign.

9. The compute cell according to claim 1, comprising a plurality of current sources, wherein one of the plurality of current sources is disposed in each conductive path.

10. The compute cell according to claim 1, wherein the logic unit comprises an output for connection to a read bit line and the at least one current source is connected between the logic unit output and a transistor of the logic unit, or wherein the at least one current source is connected between a transistor of the logic unit and a logic power supply.

11. The compute cell according to claim 1, wherein the at least one current source is provided as a long-channel transistor.

12. The compute cell according to claim 11, wherein the at least one long-channel transistor is configured for receiving a bias voltage at a gate electrode thereof, to control a saturation current of the at least one long-channel transistor.

13. An in-memory computing device for matrix-vector multiplications in machine learning applications, comprising:

a plurality of compute cells according to claim 1, organized into rows and columns of an array;

a plurality of read bit lines, each connecting logic unit outputs of compute cells arranged on a same column of the array;

a plurality of data lines, each connecting input connectors of compute cells arranged on a same row of the array;

a data line driver operatively connectable to the plurality of data lines and configured to generate, for each digital data input supplied to the driver, a set of modulated binary-valued input signals encoding a sign of the supplied data input, wherein a duty cycle of the modulated input signals is indicative of a magnitude of the supplied data input; and readout circuitry operatively connectable to the plurality of read bit lines and configured for detecting an output signal on the read bit lines of each column, the output signal being representative of the accumulated first and second charges supplied by the compute cells of that column in response to the set of input signals.

14. The in-memory computing device according to claim 13, wherein compute cells of a same row and/or column of the array are organized into groups and the in-memory computing device further comprises a controller for controlling a magnitude of the first and second charges supplied by the compute cells of a same group.

15. A compute cell for in-memory multiplication of a digital data input and a balanced ternary weight, comprising:

a set of input connectors for receiving a corresponding set of modulated input signals (A+, A−) representative of a sign and a magnitude of the digital data input;

a memory unit configured for storing the balanced ternary weight; and a logic unit connected to the set of input connectors and the memory unit to receive the data input and the balanced ternary weight, the logic unit configured to: selectively enable one of a plurality of conductive paths for supplying a first charge to a read bit line (S; S+, S−) during a duty cycle of the set of input signals if the data input and the balanced ternary weight both have a positive sign or both have a negative sign, selectively enable a different one of the plurality of conductive paths for supplying a second charge to the same one read bit line (S), or to a different one read bit line (S+, S−), during the duty cycle if the data input and the balanced ternary weight have opposite signs, and disable each of the plurality of conductive paths if at least one of the group consisting of the balanced ternary weight and the data input has zero magnitude, in order to prevent any supply of charges to the one or more read bit lines, wherein the duty cycle is indicative of the data input magnitude, and wherein a ratio of the first to the second charge is negative one if the first and second charge are supplied to a same read bit line, and positive one if the first and second charge are supplied to different read bit lines, wherein the set of input connectors comprises a first and a second single-ended input connector for receiving a modulated first and second input signal (/A+, /A−), and wherein the logic unit further comprises:

a first and a second output (OUT+, OUT−) connectable to respective ones of a differential pair of read bit lines (S+, S−);

a first transistor connected between the first output (OUT+) and the first input connector and having a gate electrode connected to the memory unit to receive a first one (W+) of a set of binary-valued weight signals encoding the balanced ternary weight, for selectively enabling a first conductive path if the data input and the balanced ternary weight both have positive sign;

a second transistor connected between the first output and the second input connector and having a gate electrode connected to the memory unit to receive a second one (W−) of the set of binary-valued weight signals encoding the balanced ternary weight, for selectively enabling a second conductive path if the data input and the balanced ternary weight both have negative sign;

a third transistor connected between the second output (OUT−) and the first input connector and having a gate electrode connected to the memory unit to receive the second binary-valued weight signal (W−), for selectively enabling a third conductive path if the data input has positive sign and the balanced ternary weight has negative sign; and a fourth transistor connected between the second output (OUT−) and the second input connector and having a gate electrode connected to the memory unit to receive the first binary-valued weight signal (W+), for selectively enabling a fourth conductive path if the data input has negative sign and the balanced ternary weight has positive sign.

16. The compute cell according to claim 15, wherein transistors with gate electrodes connected to the memory unit are provided as long-channel transistors.

17. An in-memory computing device for matrix-vector multiplications in machine learning applications, comprising:
a plurality of compute cells according to claim 15, organized into rows and columns of an array;
a plurality of read bit lines, each connecting logic unit outputs of compute cells arranged on a same column of the array;
a plurality of data lines, each connecting input connectors of compute cells arranged on a same row of the array;
a data line driver operatively connectable to the plurality of data lines and configured to generate, for each digital data input supplied to the driver, a set of modulated binary-valued input signals encoding a sign of the supplied data input, wherein a duty cycle of the modulated input signals is indicative of a magnitude of the supplied data input; and
readout circuitry operatively connectable to the plurality of read bit lines and configured for detecting an output signal on the read bit lines of each column, the output signal being representative of the accumulated first and second charges supplied by the compute cells of that column in response to the set of input signals.

18. A compute cell for in-memory multiplication of a digital data input and a balanced ternary weight, comprising:
a set of input connectors for receiving a corresponding set of modulated input signals (A+, A−) representative of a sign and a magnitude of the digital data input;
a memory unit configured for storing the balanced ternary weight; and
a logic unit connected to the set of input connectors and the memory unit to receive the data input and the balanced ternary weight, the logic unit configured to: selectively enable one of a plurality of conductive paths for supplying a first charge to a read bit line (S; S+, S−) during a duty cycle of the set of input signals if the data input and the balanced ternary weight both have a positive sign or both have a negative sign, selectively enable a different one of the plurality of conductive paths for supplying a second charge to the same one read bit line (S), or to a different one read bit line (S+, S−), during the duty cycle if the data input and the balanced ternary weight have opposite signs, and disable each of the plurality of conductive paths if at least one of the group consisting of the balanced ternary weight and the data input has zero magnitude, in order to prevent any supply of charges to the one or more read bit lines, wherein the duty cycle is indicative of the data input magnitude, and wherein a ratio of the first to the second charge is negative one if the first and second charge are supplied to a same read bit line, and positive one if the first and second charge are supplied to different read bit lines, wherein the set of input connectors comprises a pair of complementary input connectors for receiving a modulated input signal (A) and its complement (/A), and wherein the logic unit further comprises:
an output (OUT) connectable to a read bit line (S);
a first transistor of a first conductivity type having a drain electrode connected to the output (OUT), a source electrode connected to a first one of the pair of complementary input connectors to receive the input signal (A), and a gate electrode connected to the memory unit to receive a first one (/W+) of a set of binary-valued weight signals encoding the balanced ternary weight, for selectively enabling a first conductive path if the data input and the balanced ternary weight both have positive sign; and
a second transistor of a second conductivity type, opposite to the first conductivity type, having a drain electrode connected to the output (OUT), a source electrode connected to a second one of the pair of complementary input connectors to receive the complement of the input signal (/A), and a gate electrode connected to the memory unit to receive a second one (W−) of the set of binary-valued weight signals, for selectively enabling a second conductive path if the data input has positive sign and the balanced ternary weight both has negative sign.

19. An in-memory computing device for matrix-vector multiplications in machine learning applications, comprising:
a plurality of compute cells according to claim 18, organized into rows and columns of an array;
a plurality of read bit lines, each connecting logic unit outputs of compute cells arranged on a same column of the array;
a plurality of data lines, each connecting input connectors of compute cells arranged on a same row of the array;
a data line driver operatively connectable to the plurality of data lines and configured to generate, for each digital data input supplied to the driver, a set of modulated binary-valued input signals encoding a sign of the supplied data input, wherein a duty cycle of the modulated input signals is indicative of a magnitude of the supplied data input; and
readout circuitry operatively connectable to the plurality of read bit lines and configured for detecting an output signal on the read bit lines of each column, the output signal being representative of the accumulated first and second charges supplied by the compute cells of that column in response to the set of input signals.

20. The in-memory computing device according to claim 19, wherein compute cells of a same row and/or column of the array are organized into groups and the in-memory computing device further comprises a controller for controlling a magnitude of the first and second charges supplied by the compute cells of a same group.

* * * * *